(12) United States Patent
Kim et al.

(10) Patent No.: US 11,631,365 B2
(45) Date of Patent: Apr. 18, 2023

(54) DISPLAY DEVICE

(71) Applicant: Samsung Display Co., Ltd., Yongin-si (KR)

(72) Inventors: Dong Woo Kim, Yongin-si (KR); Min Kyu Woo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 17/148,369

(22) Filed: Jan. 13, 2021

(65) Prior Publication Data

US 2021/0327341 A1     Oct. 21, 2021

(30) Foreign Application Priority Data

Apr. 21, 2020   (KR) .......................... 10-2020-0048141

(51) Int. Cl.
*G09G 3/325*   (2016.01)
*G09G 3/32*    (2016.01)
(Continued)

(52) U.S. Cl.
CPC .............. *G09G 3/32* (2013.01); *H01L 27/124* (2013.01); *H01L 27/1225* (2013.01);
(Continued)

(58) Field of Classification Search
CPC .......... G09G 3/3233; G09G 2320/043; G09G 2320/045; G09G 2310/0262; G09G 2300/0426; G09G 3/3258; G09G 2300/043; G09G 3/3208; G09G 2320/0209; G09G 2320/0626; G09G 2320/0252; G09G 2320/0247; G09G 3/30; G09G 3/3266; G09G 2330/021; G09G 2320/0295; G09G 3/22; G09G 2310/0278; G09G 2310/0213; G09G 3/32; G09G 2300/0804; G09G 2300/0819; G09G 2300/0842; G09G 2300/0861; G09G 2320/0233; G09G 3/3291; G09G 2320/0257; H01L 27/3276;
(Continued)

(56) References Cited

U.S. PATENT DOCUMENTS 6,859,193 B1   2/2005 Yumoto
7,825,880 B2  11/2010 Yumoto et al.
(Continued)

FOREIGN PATENT DOCUMENTS

KR   10-0888004 B1   3/2009
KR   10-1175299 B1   8/2012
(Continued)

*Primary Examiner* — Duc Q Dinh
(74) *Attorney, Agent, or Firm* — Lewis Roca Rothgerber Christie LLP

(57) ABSTRACT

A display device including: a first power line; a second power line; a data line; a first scan line; a second scan line; a light emitting element connected between the first power line and a first node; a first transistor connected between the first node and the second power line and including a gate electrode connected to a second node; a second transistor connected between the data line and the second node and including a gate electrode connected to the first scan line; and a fourth transistor connected between the first power line and the first node and including a gate electrode connected to the second scan line.

15 Claims, 13 Drawing Sheets

(51) Int. Cl.
*H01L 27/12* (2006.01)
*H01L 29/786* (2006.01)

(52) U.S. Cl.
CPC ...... *H01L 27/1255* (2013.01); *H01L 29/7869* (2013.01); *G09G 2310/0267* (2013.01); *G09G 2310/0275* (2013.01); *G09G 2310/08* (2013.01); *G09G 2320/0626* (2013.01)

(58) Field of Classification Search
CPC ............. H01L 27/3262; H01L 27/3265; H01L 2924/12044; H01L 27/1214
USPC ...................................................... 345/73–76
See application file for complete search history.

(56) References Cited

U.S. PATENT DOCUMENTS

| | | | |
|---|---|---|---|
| 7,948,456 B2 | 5/2011 | Yamashita et al. | |
| 8,248,357 B2 | 8/2012 | Park et al. | |
| 9,030,388 B2* | 5/2015 | Qi | G09G 3/3233 345/82 |
| 10,283,047 B2 | 5/2019 | Shin et al. | |
| 10,360,826 B2 | 7/2019 | Bi et al. | |
| 10,366,652 B2 | 7/2019 | Hwang et al. | |
| 10,366,656 B2* | 7/2019 | Jeon | H01L 27/1255 |
| 10,608,020 B2* | 3/2020 | Lin | H01L 25/167 |
| 10,658,605 B2 | 5/2020 | Lee et al. | |
| 10,964,264 B1* | 3/2021 | Kim | G09G 3/3233 |
| 2011/0193856 A1* | 8/2011 | Han | G09G 3/3233 345/76 |
| 2014/0111562 A1* | 4/2014 | Wu | G09G 3/3233 315/172 |
| 2014/0354704 A1* | 12/2014 | Pak | G09G 3/2077 345/82 |
| 2015/0243217 A1* | 8/2015 | Park | G09G 3/3233 345/76 |
| 2017/0250168 A1* | 8/2017 | Do | H01L 33/42 |
| 2018/0175135 A1* | 6/2018 | Lim | H01L 27/3246 |
| 2019/0180688 A1* | 6/2019 | Yang | G09G 3/3233 |
| 2020/0066203 A1* | 2/2020 | Kim | G09G 3/3233 |

FOREIGN PATENT DOCUMENTS

| | | |
|---|---|---|
| KR | 10-1375040 B1 | 3/2014 |
| KR | 10-1413198 B1 | 6/2014 |
| KR | 10-1423235 B1 | 7/2014 |
| KR | 10-2016-0104789 A | 9/2016 |
| KR | 10-2017-0070439 A | 6/2017 |
| KR | 10-2018-0025514 A | 3/2018 |
| KR | 10-2019-0029831 A | 3/2019 |
| KR | 10-2060311 B1 | 2/2020 |

* cited by examiner

DISPLAY DEVICE

CROSS-REFERENCE TO RELATED APPLICATION

This application claims priority to and the benefit of Korean Patent Application No. 10-2020-0048141 filed in the Korean Intellectual Property Office on Apr. 21, 2020, the entire content of which is incorporated herein by reference.

BACKGROUND

1. Field

Embodiments of the present disclosure relate to a display device.

2. Description of the Related Art

A display device can display an image by using a light emitting element such as a light emitting diode as a light source of a pixel. The light emitting diode has relatively good durability even in harsh environmental conditions and excellent performance in terms of life-span and luminance. A research has been conducted to manufacture a light emitting diode using a material having a high reliability inorganic crystal structure, and to dispose it on a panel of a display device and use it as a pixel light source.

The display device includes a pixel, and the pixel may include a light emitting diode, a driving transistor that supplies a driving current to the light emitting diode, and a storage capacitor that maintains a gate-source voltage of the driving transistor (i.e., a voltage between gate and source electrodes of the driving transistor) at a specific voltage level. In addition, the pixel may further include a sensing transistor connected to a node between the driving transistor and the light emitting diode to transmit a signal related to characteristics (for example, a threshold voltage and mobility) of the driving transistor and/or light emitting characteristics (for example, current-voltage characteristics) of the light emitting diode to the outside.

The above information disclosed in this Background section is only for enhancement of understanding of the background of the disclosure, and therefore it may contain information that does not form prior art.

SUMMARY

The light emitting characteristics (for example, current-voltage characteristics) of the light emitting diode may be changed according to light emitting conditions, and thus, a gate-source voltage of the driving transistor (i.e., a voltage applied between the gate electrode and the source electrode of the driving transistor) may be changed, and the pixel may not emit light at a desired luminance. As a result, a luminance deviation (or luminance variations) may occur in the display device.

The example embodiments of the present disclosure have been made in an effort to provide a display device that may display an image with uniform luminance.

One or more example embodiments of the present disclosure provide a display device including: a first power line; a second power line; a data line; a first scan line; a second scan line; a light emitting element connected between the first power line and a first node; a first transistor connected between the first node and the second power line and including a gate electrode connected to a second node; a second transistor connected between the data line and the second node and including a gate electrode connected to the first scan line; and a fourth transistor connected between the first power line and the first node and including a gate electrode connected to the second scan line.

A first power voltage applied to the first power line may be greater than a second power voltage applied to the second power line, and an anode electrode of the light emitting element may be connected to the first power line.

The display device may further include a third transistor connected to a second electrode of the first transistor and a sensing line and including a gate electrode connected to the second scan line, wherein a first electrode of the first transistor may be connected to the first node.

The display device may further include an emission control line; and a fifth transistor connected between the second electrode of the first transistor and the second power line and including a gate electrode connected to the emission control line.

At least one of the first to fifth transistors may include an oxide semiconductor.

The display device may further include a storage capacitor between the first power line and the second node.

The display device may further include a scan driver configured to provide a first scan signal to the first scan line and to provide a second scan signal to the second scan line; an emission driver configured to provide an emission control signal to the emission control line; a data driver configured to provide a data signal to the data line; and a sensing driver configured to receive a sensing signal corresponding to a threshold voltage of the first transistor through the sensing line.

In a first period in which the emission driver is to provide the emission control signal having a gate-off voltage level to the emission control line: the scan driver may provide the first scan signal having a gate-on voltage level to the first scan line, and may provide the second scan signal having a gate-on voltage level to the second scan line; and the data driver may provide the data signal to the data line.

In a first period in which the emission driver is to provide the emission control signal having a gate-off voltage level to the emission control line: the scan driver may provide the first scan signal having a gate-on voltage level to the first scan line, and may provide the second scan signal having a gate-off voltage level to the second scan line; and the data driver may provide the data signal to the data line.

In a second period in which the emission driver is to provide the emission control signal having a gate-off voltage level to the emission control line, the scan driver may provide the first scan signal having a gate-on voltage level to the first scan line and may provide the second scan signal having a gate-on voltage level to the second scan line; in the second period, the data driver may provide a reference voltage to the data line; and the sensing driver may apply an initialization voltage to the sensing line in a first sub-period of the second period and may receive the sensing signal in a second sub-period of the second period.

The display device may further include a storage capacitor between the second electrode of the first transistor and the second node.

The light emitting element may include a plurality of light emitting elements connected in parallel to each other.

Each of the light emitting elements may include an anode electrode and a cathode electrode, and the anode electrode of at least one of the light emitting elements may be connected to the cathode electrode of other ones of the light emitting elements.

Another example embodiment of the present disclosure provides a display device including: a first power line; a second power line; a data line; a sensing line; a first scan line; a second scan line; a light emitting element connected between the first power line and a first node; a first transistor connected between the first node and the second power line and including a gate electrode connected to a second node; a second transistor connected between the data line and the second node and including a gate electrode connected to the first scan line; and a third transistor connected between the first node and the sensing line and including a gate electrode connected to the second scan line.

A first power voltage applied to the first power line may be greater than a second power voltage applied to the second power line, and an anode electrode of the light emitting element may be connected to the first power line.

The display device may further include a storage capacitor between the first power line and the second node.

The display device may further include a storage capacitor between the second node and the second power line.

The display device may further include a scan driver configured to provide a first scan signal to the first scan line and a second scan signal to the second scan line; a data driver configured to provide a data signal to the data line; and a sensing driver configured to receive a sensing signal corresponding to a threshold voltage of the first transistor through the sensing line.

In a first period, a first power voltage applied to the first power line may be changed to be less than a second power voltage applied to the second power line; in the first period, the scan driver may provide the first scan signal having a gate-on voltage level to the first scan line, and may provide the second scan signal having a gate-on voltage level to the second scan line; in the first period, the data driver may provide a reference voltage to the data line; and the sensing driver may apply an initialization voltage to the sensing line in a first sub-period of the first period, and may receive the sensing signal in a second sub-period of the first period.

According to one or more example embodiments of the display device of the present disclosure, a light emitting element in a pixel may be connected between a first power line (for example, a high power voltage) and a first electrode of the first transistor. Therefore, regardless of change in characteristics of the light emitting element, a gate-source voltage of the first transistor (i.e., a voltage between a second electrode and a gate electrode of the first transistor) may be controlled only by a data voltage applied to the gate electrode of the first transistor, and the pixel may emit light at a desired luminance and the display device may have a uniform luminance (or a substantially uniform luminance).

In one or more example embodiments, the pixel may include a fourth transistor connected between the first power line and the first electrode of the first transistor, and a third transistor connected to the second electrode of the first transistor. Therefore, the display device may sense a characteristic (for example, a threshold voltage) of the first transistor T1 and eliminate (or reduce) a luminance deviation (or luminance variations) due to change in the characteristic of the first transistor.

DETAILED DESCRIPTION

Figure 1A:
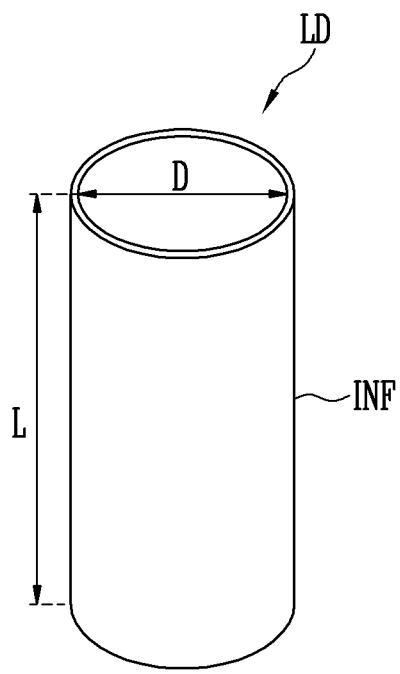
FIG. 1A and FIG. 1B illustrate a perspective view and a cross-sectional view of a light emitting element according to an example embodiment, respectively.

Aspects and features of the present disclosure and methods of accomplishing the same may be understood more readily with reference to the following detailed description of example embodiments and the accompanying drawings. However the present disclosure is not limited to the example embodiments described hereinafter, and may be embodied in many different forms. The following example embodiments are provided to make the present disclosure complete and to allow those skilled in the art to clearly understand the scope of the present disclosure, and the present disclosure is defined by the scope of the appended claims and their equivalents.

It will be understood that when an element or a layer is referred to as being 'on' another element or layer, it can be directly on another element or layer, or intervening element or layer may also be present. The shapes, sizes, ratios, angles, numbers, and the like disclosed in the drawings for describing example embodiments of the present disclosure are illustrative, and thus the present disclosure is not limited to the illustrated example embodiments. Throughout the specification, the same reference numerals denote the same constituent elements. In addition, in order to clarify the present disclosure, parts not related to the description thereof are omitted from or simplified in the drawings.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the present disclosure. Singular forms are intended to include plural forms unless the context clearly indicates otherwise.

Each of the features of the various example embodiments of the present disclosure may be coupled or combined with each other partly or entirely, and may be technically variously interlocked and driven in a manner that is sufficiently understandable to those skilled in the art. Each example embodiment may be practicable independently of each other and may be practicable with together in an interrelationship.

Hereinafter, example embodiments of the present disclosure will be described in detail with reference to the accompanying drawings.

Figure 1B:
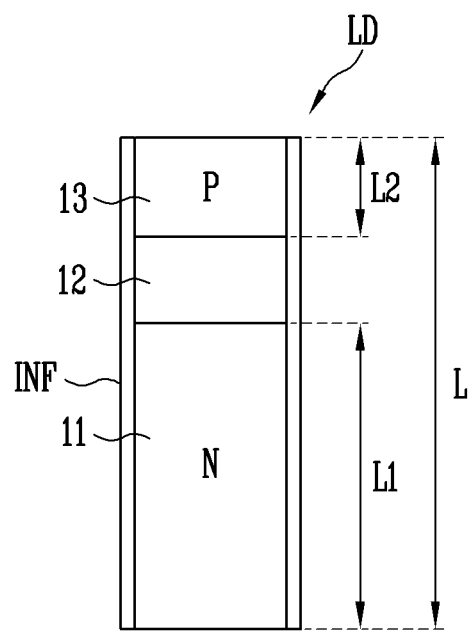

FIG. 1A and FIG. 1B illustrate a perspective view and a cross-sectional view of a light emitting element according to an example embodiment, respectively. In FIG. 1A and FIG. 1B, a cylindrical rod-shaped light emitting element LD is illustrated, but a type and/or shape of the light emitting element LD according to the present disclosure is not limited thereto.

Referring to FIG. 1A and FIG. 1B, the light emitting element LD according to an example embodiment of the present disclosure may include a first semiconductor layer 11, a second semiconductor layer 13, and an active layer 12 interposed between the first semiconductor layer 11 and the second semiconductor layer 13. For example, the light emitting element LD may be configured as a stacked body in which the first semiconductor layer 11, the active layer 12, and the second semiconductor layer 13 are sequentially stacked along one direction.

According to one or more example embodiments, the light emitting element LD may have a rod shape extending along one direction. The light emitting element LD may have one end portion and the other end portion along one direction.

In some embodiments, one of the first and second semiconductor layers 11 and 13 may be disposed at one end portion of the light emitting element LD, and the other one of the first and second semiconductor layers 11 and 13 may be disposed at the other end portion of the light emitting element LD.

In some embodiments, the light emitting element LD may be a rod-shaped light emitting diode. Here, the rod shape includes a rod-like shape or a bar-like shape, of which a length in a longitudinal direction is longer than a length in a width direction thereof, such as a cylinder or polygonal column, and a shape of a cross section thereof is not particularly limited. For example, a length L of the light emitting element LD may be greater than a diameter D thereof (or a width of a cross section thereof).

In some embodiments, the light emitting element LD has a size as small as a nanometer scale to a micrometer scale, for example, a diameter D and/or a length L ranging from about 100 nm to about 10 um. However, the size of the light emitting element LD is not limited thereto. For example, the size of the light emitting element LD may be variously changed according to design conditions of various devices using a light emitting device using the light emitting element LD as a light source, for example, a display device.

The first semiconductor layer 11 may include at least one n-type semiconductor material. For example, the first semiconductor layer 11 may include one semiconductor material of InAlGaN, GaN, AlGaN, InGaN, AlN, and InN, and it may include an n-type semiconductor material doped with a first conductive dopant such as Si, Ge, and Sn. However, the material included in the first semiconductor layer 11 is not limited thereto, and the first semiconductor layer 11 may be made of various materials.

The active layer 12 is formed on the first semiconductor layer 11, and may be formed to have a single or multiple quantum well structure. When the active layer 12 includes a material having the multiple quantum well structure, a plurality of quantum layers and well layers may be alternately stacked.

When a suitable voltage (e.g., a set voltage or a predetermined voltage) or more is applied between end portions of the light emitting element LD, the light emitting element LD emits light while electron-hole pairs are combined in the active layer 12. By controlling the emission of the light emitting element LD by using this principle, the light emitting element LD may be used as a light source for various light emitting devices in addition to pixels of a display device.

The active layer 12 may emit light having a wavelength of 400 nm to 900 nm. For example, when the active layer 12 emits light in a blue or green wavelength band, it may include an inorganic material including nitrogen such as AlGaN or AlGaInN. For example, when the active layer 12 has a structure in which a quantum layer and a well layer are alternately stacked in a multi-quantum well structure, the quantum layer may include an inorganic material such as AlGaN or AlGaInN, and the well layer may include an inorganic material such as GaN or AlInN. In one or more example embodiments, the active layer 12 may include AlGaInN as a quantum layer and AlInN as a well layer.

However, the present disclosure is not limited thereto, and the active layer 12 may have a structure in which a semiconductor material having large band gap energy and a semiconductor material having small band gap energy are alternately stacked, or may include group III to group V semiconductor materials according to a wavelength band of light emitted from the active layer 12. Light emitted from the active layer 12 is not limited to light in a blue or green wavelength band, and may be light in a red wavelength band depending on a material included therein.

On the other hand, the light emitted from the active layer 12 may be emitted from both sides as well as an outer surface in a longitudinal direction of the light emitting element LD. A direction of light emitted from the active layer 12 is not limited to one direction.

The second semiconductor layer 13 is disposed on the active layer 12, and may include a semiconductor material of a type different from that of the first semiconductor layer 11. For example, the second semiconductor layer 13 may include at least one p-type semiconductor material. For example, the second semiconductor layer 13 may include at least one semiconductor material from among InAlGaN, GaN, AlGaN, InGaN, AlN, and InN, and may include a p-type semiconductor material doped with a second conductive dopant such as Mg, Ca, or Ba. However, the material included in the second semiconductor layer 13 is not limited thereto, and the second semiconductor layer 13 may be formed of various materials.

In one or more example embodiments, the drawing shows that the first semiconductor layer 11 and the second semiconductor layer 13 are each formed as one layer, but the present disclosure is not limited thereto. For example, the first semiconductor layer 11 and the second semiconductor layer 13 may include a larger number of layers depending on the material of the active layer 12. For example, the first semiconductor layer 11 and the second semiconductor layer 13 may further include a clad layer or a tensile strain barrier reducing (TSBR) layer.

In some embodiments, a first length L1 of the first semiconductor layer 11 may be longer than a second length L2 of the second semiconductor layer 13.

In some embodiments, the light emitting element LD may further include an insulating film INF provided on a surface thereof. The insulating film INF may be formed on the surface of the light emitting element LD so as to surround an outer surface (e.g., an outer peripheral surface or an outer circumferential surface) of the active layer 12, and may further surround the first and second semiconductor layers 11 and 13.

In some embodiments, the insulating film INF may expose both end portions of the light emitting element LD having different polarities. For example, the insulating film INF may not cover one end (for example, two planes of a cylinder (e.g., upper and lower surface)) of each of the first and second semiconductor layers 11 and 13 disposed at respective ends of the light emitting element LD in a longitudinal direction, and may expose it. In some embodiments, the insulating film INF may expose one of the end portions of the light emitting element LD.

In some embodiments, the insulating film INF may include a transparent insulating material. For example, the insulating film INF may be made of $SiO_x$ or $SiN_x$ that is not particularly determined as $SiO_2$ or $Si_3N_4$, but is not limited thereto. A constituent material of the insulating film INF is not particularly limited, and the insulating film INF may be made of various insulating materials currently known to those skilled in the art.

The insulating film INF may prevent or substantially prevent an electrical short circuit that may occur when the active layer 12 contacts conductive materials other than the first semiconductor layer 11 and the second semiconductor layer 13. In one or more example embodiments, by forming the insulating film INF, a surface defect of the light emitting element LD may be reduced or minimized, thereby improving lifetime and efficiency of the light emitting element LD. In one or more example embodiments, when a plurality of light emitting elements LD are closely disposed, the insulating film INF may prevent or substantially prevent unwanted short circuits that may occur between respective light emitting elements LD.

In one or more example embodiments, the light emitting element LD may further include additional constituent elements disposed on upper portions and/or lower portions of respective layers of the light emitting element LD in addition to the first semiconductor layer 11, the active layer 12, the second semiconductor layer 13 and/or the insulating film INF. For example, the light emitting element LD may further include one or more of a phosphor layer, an active layer, a semiconductor material layer, and/or an electrode layer disposed on one side of the first semiconductor layer 11, the active layer 12, and/or the second semiconductor layer 13.

Figure 2A:
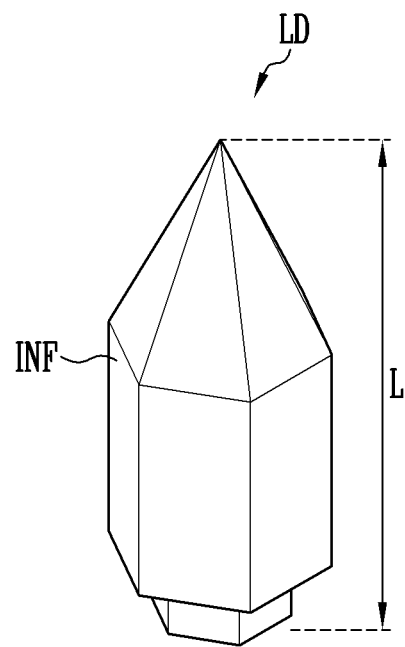
FIG. 2A and FIG. 2B illustrate a perspective view and a cross-sectional view of a light emitting element according to another example embodiment, respectively.
Figure 2B:
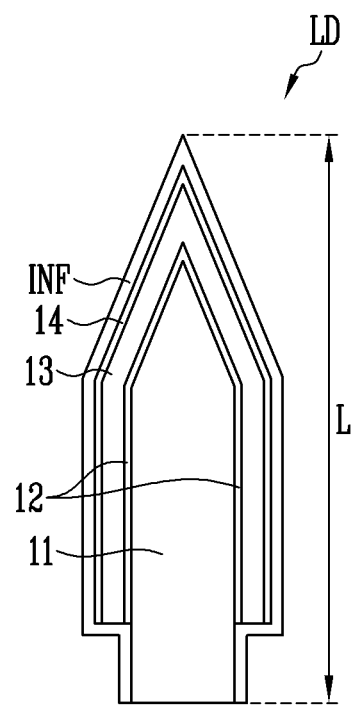

FIG. 2A and FIG. 2B illustrate a perspective view and a cross-sectional view of a light emitting element according to another example embodiment, respectively.

Referring to FIG. 2A and FIG. 2B, the light emitting element LD according to the example embodiment of the present disclosure may include a first semiconductor layer 11, a second semiconductor layer 13, and an active layer 12 interposed between the first semiconductor layer 11 and the second semiconductor layer 13. According to the example embodiment, the first semiconductor layer 11 is disposed in a central region of the light emitting element LD, and the active layer 12 may be disposed on the surface of the first semiconductor layer 11 to surround at least one region of the first semiconductor layer 11. For example, the active layer 12 may be disposed along the outer edge or peripheral region of the first semiconductor layer 11 to surround at least one region of the first semiconductor layer 11. In one or more example embodiments, the second semiconductor layer 13 may be disposed on a surface of the active layer 12 to surround at least one region of the active layer 12. For example, the second semiconductor layer 13 may be disposed along the outer edge or peripheral region of the active layer 12 to surround at least one region of the active layer 12.

Further, the light emitting element LD may further include an electrode layer 14 and/or an insulating film INF surrounding at least one region of the second semiconductor layer 13. For example, the light emitting element LD may include the electrode layer 14 disposed on a surface of the second semiconductor layer 13 so as to surround one region of the second semiconductor layer 13, and the insulating film INF may be disposed on a surface of the electrode layer 14 so as to surround at least one region of the electrode layer 14. For example, the electrode layer 14 may be disposed along the outer edge or peripheral region of the second semiconductor layer 13 to surround at least one region of the second semiconductor layer 13, and the insulating film INF may be disposed along the outer edge or peripheral region of the electrode layer 14 to surround at least one region of the electrode layer 14. For example, the light emitting element LD may be realized as a core-shell structure including the first semiconductor layer 11, the active layer 12, the second semiconductor layer 13, the electrode layer 14, and the insulating film INF sequentially disposed from a center to an outer direction. In some embodiments, the electrode layer 14 and/or the insulating film INF may be omitted.

In some embodiments, the light emitting element LD may be provided to have a polygonal horn shape extending along one direction (for example, the length L direction). For example, the light emitting element LD may have a hexagonal horn shape. However, the shape of the light emitting element LD is not limited thereto, and may be variously changed.

In one or more example embodiments, both end portions of the first semiconductor layer 11 along the length L direction of the light emitting element LD may have a protruding shape. The shapes of both end portions of the first semiconductor layer 11 may be different from each other. For example, one end portion disposed at an upper side of both end portions of the first semiconductor layer 11 may have a horn shape having one vertex as a width thereof narrows toward an upper portion of the horn. In one or more example embodiments, the other end portion disposed at a lower side of both end portions of the first semiconductor layer 11 may have a polygonal column shape having a constant width.

In some embodiments, the first semiconductor layer 11 may be positioned at a core of the light emitting element LD, for example, at a center (or central region) of the light emitting element LD. In one or more example embodiments, the light emitting element LD may have a shape corresponding to a shape of the first semiconductor layer 11. For example, when the first semiconductor layer 11 has a hexagonal horn shape, the light emitting element LD may have a hexagonal horn shape.

Figure 3A:
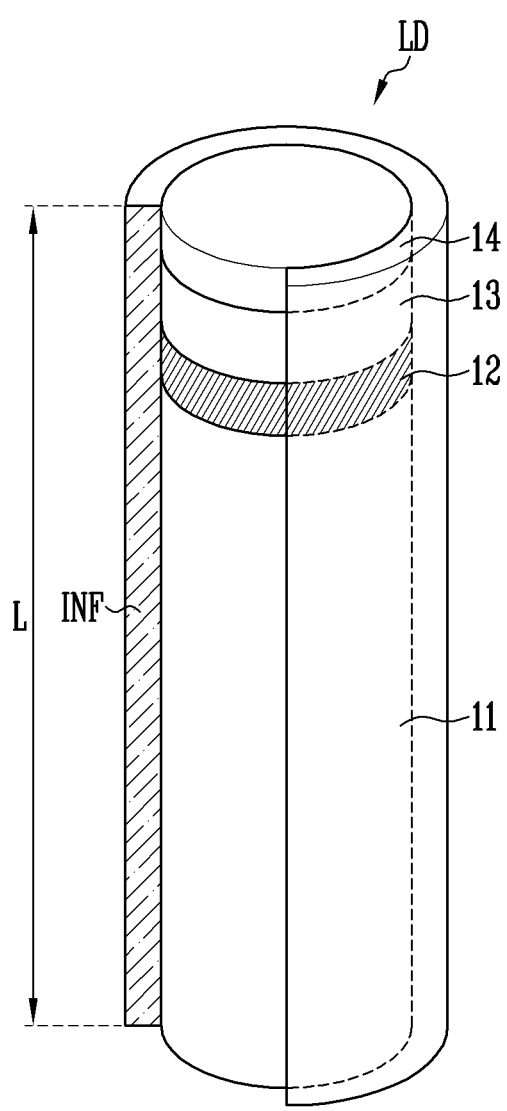
FIG. 3A and FIG. 3B illustrate a perspective cutaway view and a cross-sectional view of a light emitting element according to another example embodiment, respectively.
Figure 3B:
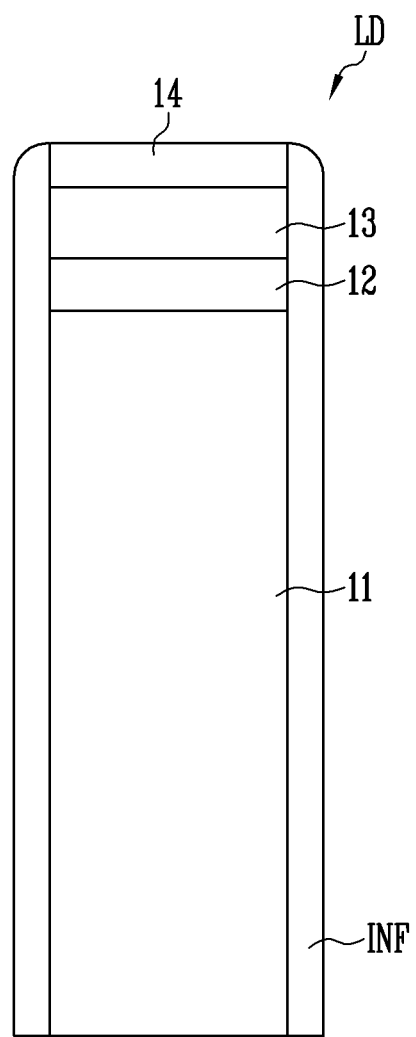

FIG. 3A and FIG. 3B illustrate a perspective cutaway view and a cross-sectional view of a light emitting element according to another embodiment, respectively. In FIG. 3A and FIG. 3B, a part of the insulating film INF is omitted for convenience of description.

Referring to FIG. 1A, FIG. 1B, FIG. 3A, and FIG. 3B, the light emitting element LD may further include an electrode layer 14 disposed on the second semiconductor layer 13.

The electrode layer 14 may be an ohmic contact electrode electrically connected to the second semiconductor layer 13, but is not limited thereto. In some embodiments, the electrode layer 14 may be a Schottky contact electrode. The electrode layer 14 may include a metal or a metal oxide, for example, Cr, Ti, Al, Au, Ni, an indium tin oxide (ITO), an indium zinc oxide (IZO) and an indium tin-zinc oxide (ITZO), and an oxide thereof or an alloy thereof, which may be used alone or in combination. In some embodiments, the electrode layer 14 may be substantially transparent or transflective. Accordingly, light generated by the active layer 12 of the light emitting element LD may transmit through the electrode layer 14 and may be emitted to the outside of the light emitting element LD.

In some embodiments, the insulating film INF may have a curved shape in at least a portion of an edge region adjacent to the electrode layer 14. In some embodiments, the curved surface shape may be formed by an etching process when the light emitting element LD is manufactured.

On the other hand, as in the light emitting element LD shown in FIG. 1A and FIG. 1B, even when the light emitting element LD does not include the electrode layer 14, the insulating film INF may have a curved shape in at least a portion of the edge region.

Figure 4:
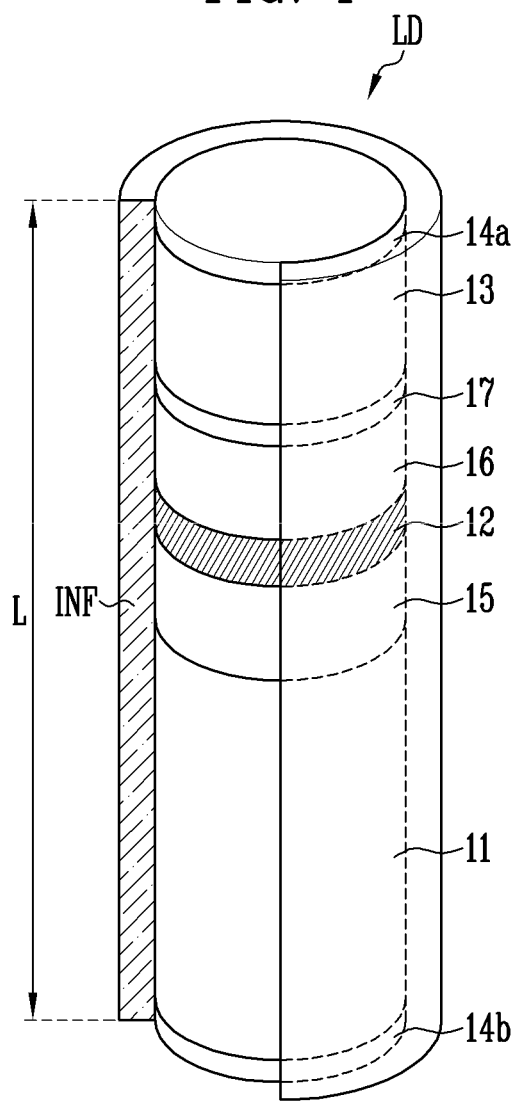
FIG. 4 illustrates a perspective cutaway view of a light emitting element according to another example embodiment.

FIG. 4 illustrates a perspective cutaway view of a light emitting element according to another example embodiment. In FIG. 4, a portion of the insulating film INF is omitted for convenience of description.

Referring to FIG. 1A, FIG. 1B, and FIG. 4, the light emitting element LD may further include a third semiconductor layer 15, a fourth semiconductor layer 16, and a fifth semiconductor layer 17. The third semiconductor layer 15 may be disposed between the first semiconductor layer 11 and the active layer 12. The fourth semiconductor layer 16 and the fifth semiconductor layer 17 may be disposed between the active layer 12 and the second semiconductor layer 13. In one or more example embodiments, the light emitting element LD may further include a first electrode layer 14a formed on an upper surface of the second semiconductor layer 13 and a second electrode layer 14b formed on a lower surface of the first semiconductor layer 11.

The light emitting element LD of FIG. 4 is different from the light emitting element LD of FIG. 1A in that the light emitting element LD of FIG. 4 further includes the third, fourth, and fifth semiconductor layers 15, 16, and 17 and the first and second electrode layers 14a, and 14b, and the active layer 12 includes other elements. The first semiconductor layer 11, the second semiconductor layer 13, and the insulating film INF may be substantially the same as the first semiconductor layer 11, the second semiconductor layer 13, and the insulating film INF described with reference to FIG. 1A.

In some embodiments, each of the active layer 12 and the semiconductor layers 11, 13, 15, 16, and 17 of the light emitting element LD of FIG. 4 may include at least phosphorus (P). As described with reference to FIG. 1A, when the active layer 12 includes nitrogen (N), the light emitting element LD may emit blue or green light. In one or more example embodiments, when each of the active layer 12 and the semiconductor layers 11, 13, 15, 16, and 17 includes at least phosphorus (P), the light emitting element LD may emit red light. For example, the light emitting element LD may emit red light having a central wavelength band of 620 nm to 750 nm.

As described with reference to FIG. 1A and FIG. 1B, the first semiconductor layer 11 may include an n-type semiconductor material. When the light emitting element LD emits red light, the first semiconductor layer 11 may include a semiconductor material having a chemical formula of $In_xAl_yGa_{1-x-y}P(0 \leq x \leq 1, 0 \leq y \leq 1, 0 \leq x+y \leq 1)$. For example, the first semiconductor layer 11 may be (or may include) n-AlGaInP doped with n-type dopant Si.

As described with reference to FIG. 1A and FIG. 1B, the second semiconductor layer 13 may include an p-type semiconductor material. When the light emitting element LD emits red light, the second semiconductor layer 13 may include a semiconductor material having a chemical formula of $In_xAl_yGa_{1-x-y}P(0 \leq x \leq 1, 0 \leq y \leq 1, 0 \leq x+y \leq 1)$. For example, the second semiconductor layer 13 may be (or may include) p-GaP doped with p-type dopant Mg.

The active layer 12 may be disposed between the first semiconductor layer 11 and the second semiconductor layer 13. As described with reference to FIG. 1A and FIG. 1B, the active layer 12 may include a material having a single or multiple quantum well structure, and may emit light having a specific wavelength band. For example, when the active layer 12 emits light in a red wavelength band, the active layer 12 may include a material such as AlGaP or AlGaInP. As another example, when the active layer 12 has a multiple quantum well structure in which the quantum layer and the well layer are alternately stacked, the quantum layer may include a material such as AlGaP or AlGaInP, and the well layer may include a material such as GaP or AlInP. In one or more example embodiments, the active layer 12 may emit red light having a central wavelength band of 620 nm to 750 nm by including AlGaInP as the quantum layer and AlInP as the well layer.

The third semiconductor layer 15 and the fourth semiconductor layer 16 may be disposed adjacent to upper and lower portions of the active layer 12, and may be referred to as a clad layer.

The third semiconductor layer 15 may be disposed between the first semiconductor layer 11 and the active layer 12. The third semiconductor layer 15, similar to the first semiconductor layer 11, may include an n-type semiconductor material. For example, the third semiconductor layer 15 may include a semiconductor material having a chemical formula of $In_xAl_yGa_{1-x-y}P(0 \leq x \leq 1, 0 \leq y \leq 1, 0 \leq x+y \leq 1)$. In the embodiment, the first semiconductor layer 11 may be (or may include) n-AlGaInP, and the third semiconductor layer 15 may be (or may include) n-AlInP. However, it is not limited thereto.

The fourth semiconductor layer 16 may be disposed between the active layer 12 and the second semiconductor layer 13. The fourth semiconductor layer 16 may be a p-type semiconductor, similar to the second semiconductor layer 13, and for example, the fourth semiconductor layer 16 may include a semiconductor material having a chemical formula of $In_xAl_yGa_{1-x-y}P(0 \leq x \leq 1, 0 \leq y \leq 1, 0 \leq x+y \leq 1)$. In one or more example embodiments, the second semiconductor layer 13 may be (or may include) p-GaP, and the fourth semiconductor layer 16 may be (or may include) p-AlInP.

The fifth semiconductor layer 17 may be disposed between the fourth semiconductor layer 16 and the second semiconductor layer 13. The fifth semiconductor layer 17 may be a p-type doped semiconductor, similar to the second semiconductor layer 13 and the fourth semiconductor layer 16. The fifth semiconductor layer 17 may have a function of reducing a difference in lattice constant between the fourth semiconductor layer 16 and the second semiconductor layer 13. For example, the fifth semiconductor layer 17 may be a tensile strain barrier reducing (TSBR) layer. For example, the fifth semiconductor layer 17 may include p-GaInP, p-AlInP, or p-AlGaInP, but is not limited thereto.

The first electrode layer 14a may be disposed on an upper surface of the second semiconductor layer 13, and the second electrode layer 14b may be disposed on a lower surface of the first semiconductor layer 11. In some embodiments, at least one of the first electrode layer 14a and the second electrode layer 14b may be omitted. The first electrode layer 14a and the second electrode layer 14b may each include at least one of the materials discussed with respect to the electrode layer 14 of FIG. 3A.

Figure 5:
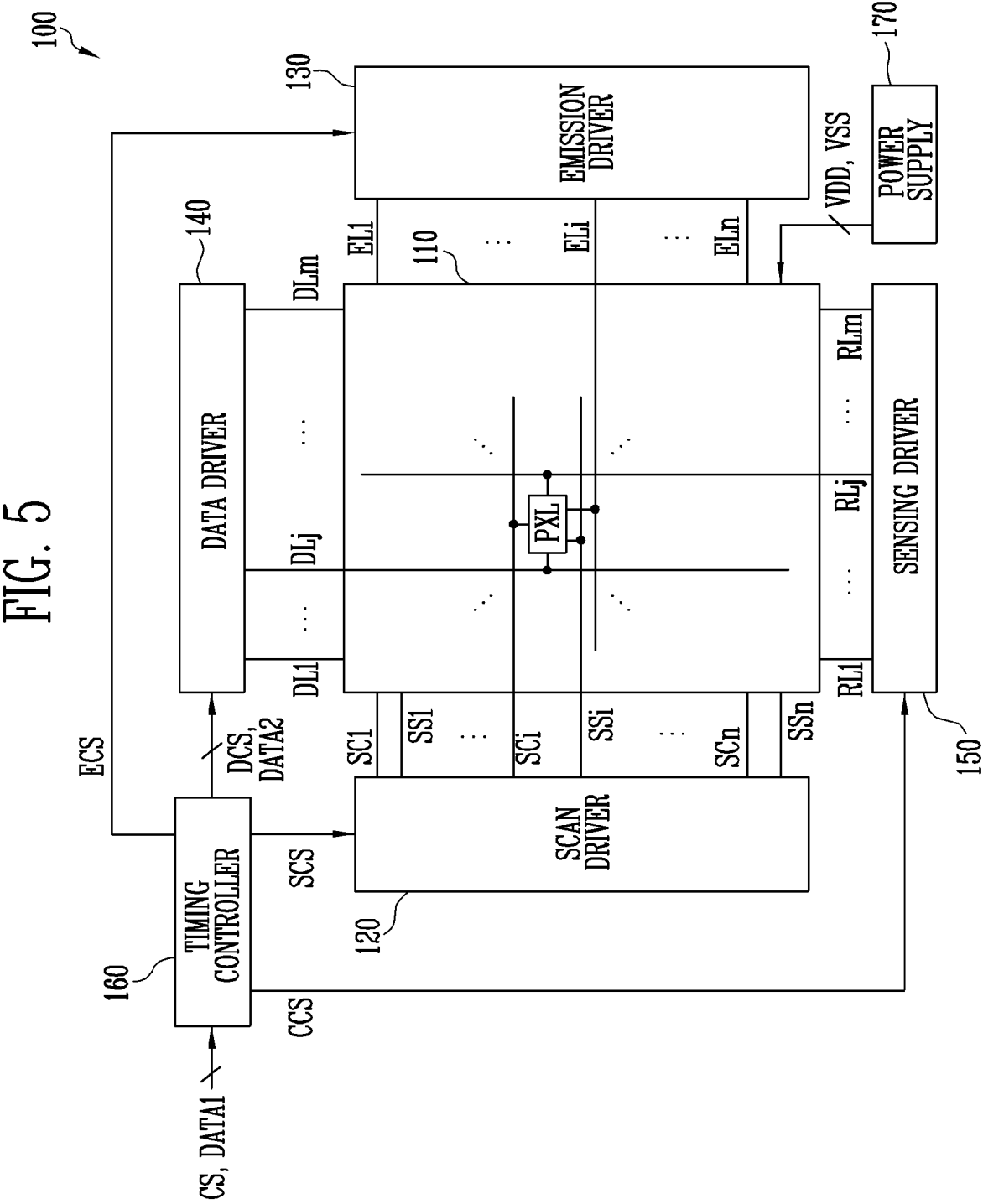
FIG. 5 illustrates a block diagram of a display device according to one or more example embodiments of the present disclosure.

FIG. 5 illustrates a block diagram of a display device according to one or more example embodiments of the present disclosure. In some embodiments, FIG. 5 may use the light emitting element LD described in FIG. 1A-FIG. 4 as a light source.

Referring to FIG. 5, a display device 100 may include a display part 110 (or a display panel), a scan driver 120 (or a gate driver), a light emitting driver 130 (or an emission driver or an emission control driver), a data driver 140 (or a source driver), a sensing part 150 (or a sensing driver), a timing controller 160, and a power supply 170.

The display part 110 may include scan lines SC1 to SCn (or first scan lines) (wherein n is a positive integer), data lines DL1 to DLm (wherein m is a positive integer), and a plurality of pixels PXL. In one or more example embodiments, the display part 110 may further include emission control lines EL1 to ELn, sensing scan lines SS1 to SSn (or second scan lines), and sensing lines RL1 to RLm (or lead-out lines).

A pixel PXL from among the plurality of pixels may be provided in an area (for example, a pixel area) partitioned by the scan lines SC1 to SCn and the data lines DL1 to DLm.

The pixel PXL may be connected to a corresponding one of the scan lines SC1 to SCn and a corresponding one of the data lines DL1 to DLm. In one or more example embodiments, the pixel PXL may be connected to a corresponding one of the emission control lines EL1 to ELn, a corresponding one of the sensing scan lines SS1 to SSn, and a corresponding one of the sensing lines RL1 to RLm. Hereinafter, "connection" may include not only an electrical connection, but also a physical connection, and may include not only direct connection, but also indirect connection through another constituent element.

The pixel PXL may include a light emitting element and at least one transistor for providing a driving current to the light emitting element.

The pixel PXL may emit light at a luminance corresponding to a data voltage (or data signal) provided through a data line (for example, a j-th data line DLj (j is a positive integer less than or equal to m)) in response to a first scan signal provided through a scan line (for example, an i-th scan line SCi (i is a positive integer less than or equal to n)). An emission period of the pixel PXL may be adjusted based on an emission control signal provided through an emission control line (for example, an i-th emission control line ELi). In one or more example embodiments, the pixel PXL may output characteristic information (for example, information about a threshold voltage and/or mobility of a driving transistor and/or a current-voltage characteristic of a light emitting device, a sensing voltage or a sensing current) of the light emitting element through the sensing line (for example, the j-th sensing line RLj) in response to the second scan signal provided through the sensing scan line (for example, the i-th sensing scan line SSi).

A detailed structure and operation of the pixel PXL will be described later with reference to FIG. 6 and FIG. 7A-FIG. 7C.

Referring back to FIG. 5, the scan driver 120 may generate a first scan signal based on a scan control signal SCS, and sequentially provide the first scan signal to the scan lines SC1 to SCn. Here, the scan control signal SCS may include a scan start signal (or scan start pulse), scan clock signals, and the like, and may be provided from the timing controller 160. For example, the scan driver 120 may include a shift register (or stage) that sequentially generates and outputs a pulse-type first scan signal corresponding to a pulse-type scan start signal (for example, a gate-on voltage level pulse) by using the scan clock signals.

The scan driver 120 may generate a second scan signal (or a sensing control signal) similar to the first scan signal, and sequentially provide the second scan signal to the sensing scan lines SS1 to SSn.

The emission driver 130 may generate an emission control signal based on an emission driving control signal ECS, and sequentially provide the emission control signal to the emission control lines EL1 to ELn. Here, the emission driving control signal ECS may include an emission start signal (or emission start pulse), emission clock signals, and the like, and may be provided from the timing controller 160. For example, the emission driver 130 may include a shift register (or stage) that sequentially generates and outputs a pulse-type emission control signal corresponding to a pulse-type emission start signal (for example, a gate-off voltage level pulse) by using the emission clock signals. In some embodiments, the emission driver 130 and the emission control lines EL1 to ELn may be omitted.

The data driver 140 may generate data signals (or data voltages) based on image data DATA2 and a data control signal DCS provided from the timing controller 160, and transmit the data signals to the data lines DL1 to DLm. Here, the data control signal DCS is a signal that controls an operation of the data driver 140, and may include a load signal (or data enable signal) indicating an output of an effective data voltage.

In one or more example embodiments, the data driver 140 may generate a data signal (or data voltage) corresponding to a data value (or grayscale value) included in the image data DATA2 by using gamma voltages. Here, the gamma voltages may be generated by the data driver 140, or may be provided from a separate gamma voltage generation circuit (for example, a gamma integrated circuit). For example, the data driver 140 may select one of the gamma voltages based on the data value to output it as a data signal.

The sensing driver 150 may provide an initialization voltage to the sensing lines RL1 to RLm based on a compensation control signal CCS in a sensing mode (or sensing period), and may sense an emission characteristic of the pixel PXL through the sensing lines RL1 to RLm. Here, the compensation control signal CCS may be provided from the timing controller 160.

For reference, the display device 100 may operate in a sensing mode (or sensing period) or a display mode (or display period). In the display mode, the display device 100 may provide a data voltage to the pixel PXL to emit light corresponding to the data voltage from a light emitting element LD in the pixel PXL, and in the sensing mode, the display device 100 may sense the emission characteristic of the pixel PXL. A sensing time corresponding to the sensing mode may be allocated before or after the display period, and in some cases, the display period and the sensing period may be included in one frame (or frame period).

The emission characteristic of the pixel PXL may include a threshold voltage and mobility of at least one transistor (for example, a driving transistor) in the pixel PXL, and characteristic information (for example, a current-voltage characteristic) of the light emitting element. For example, the sensing driver 150 may detect a sensing value (or a sensing voltage or a sensing current) corresponding to the emission characteristic of the pixel PXL through the sensing lines RL1 to RLm.

The sensing value may be provided to the timing controller 160, and the timing controller 160 may compensate for the image data DATA2 (or an input image data DATA1) based on the sensing value. However, the present disclosure is not limited thereto, and for example, the sensing value may be provided from the sensing driver 150 to the data driver 140, and the data driver 140 may generate a data voltage based on the sensing value. For example, the data driver 140 may change or compensate for the data voltage based on an amount of change in the sensing value. For example, the data voltage may be compensated based on the emission characteristic (or change in the emission characteristic) of the sensed pixel PXL.

The timing controller 160 may receive the input image data DATA1 and the control signal CS from the outside (for example, a graphic processor), generate the scan control signal SCS, the emission driving control signal ECS, and the data control signal DCS based on the control signal CS, and convert the input image data DATA1 to generate the image data DATA2. Here, the control signal CS may include a vertical synchronization signal, a horizontal synchronization signal, a clock signal, and the like. For example, the timing controller 160 may convert the input image data DATA1 into the image data DATA2 having a format usable by the data driver 140.

In one or more example embodiments, the timing controller 160 may further generate the compensation control signal CCS based on the control signal CS. The compensation control signal CCS may be provided to the sensing driver 150.

The power supply 170 may provide a first power voltage VDD (or a high power voltage) and a second power voltage VSS (or a low power voltage) to the display part 110. The first power voltage VDD and the second power voltage VSS are voltages required for an operation of the pixel PXL, and the first power voltage VDD may have a voltage level higher than that of the second power voltage VSS. The power supply 170 may provide a driving voltage to at least one of the scan driver 120, the emission driver 130, the data driver 140, and the sensing driver 150.

In one or more example embodiments, as shown in FIG. 5, the scan driver 120, the emission driver 130, the data driver 140, the sensing driver 150, and the timing controller 160 are illustrated as being configured independently of each other, but are not limited thereto. For example, at least one of the scan driver 120, the emission driver 130, the data driver 140, the sensing driver 150, and the timing controller 160 may be formed in the display part 110, or realized as an integrated circuit (IC) and mounted on a flexible circuit board to be connected to the display part 110. For example, the scan driver 120 and the emission driver 130 may be formed in the display part 110. In one or more example embodiments, at least two of the scan driver 120, the emission driver 130, the data driver 140, the sensing driver 150, and the timing controller 160 may be implemented in an IC. For example, the data driver 140 and the sensing driver 150 may be implemented as one integrated circuit.

Figure 6:
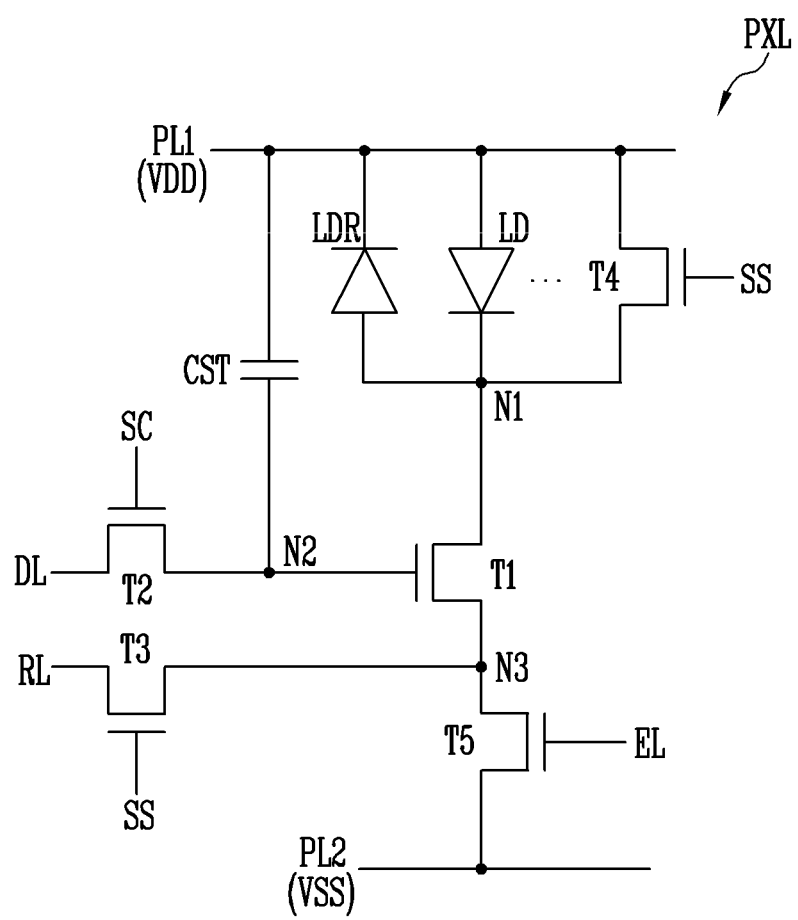
FIG. 6 illustrates a circuit diagram of an example of a pixel included in the display device of FIG. 5.

FIG. 6 illustrates a circuit diagram of an example of a pixel included in the display device of FIG. 5.

Referring to FIG. 6, the pixel PXL may be connected to a scan line SC, a sensing scan line SS, an emission control line EL, a data line DL, and a sensing line RL. For example, the scan line SC, the sensing scan line SS, the emission control line EL, the data line DL, and the sensing line RL may respectively correspond to the i-th scan line SCi, the i-th sensing scan line SSi, the i-th emission control line ELi, the j-th data line DLj, and the j-th sensing line RLj. In one or more example embodiments, the pixel PXL may be connected between a first power line PL1 and a second power line PL2. Here, the first power voltage VDD described with reference to FIG. 5 may be applied to the first power line PL1, and the second power voltage VSS described with reference to FIG. 5 may be applied to the second power line PL2.

The pixel PXL may include at least one light emitting element, a first transistor T1 (or a driving transistor), a second transistor T2 (or a first switching transistor), a third transistor T3 (or a sensing transistor), a fourth transistor T4 (or a second switching transistor), a fifth transistor T5 (or an emission control transistor), and a storage capacitor CST. Each of the first transistor T1, the second transistor T2, the third transistor T3, the fourth transistor T4, and the fifth transistor T5 may include an oxide semiconductor, and may be, for example, an N-type transistor. However, the first transistor T1, the second transistor T2, the third transistor T3, the fourth transistor T4, and the fifth transistor T5 are not limited thereto, and at least one of the first transistor T1, the second transistor T2, the third transistor T3, the fourth transistor T4, and the fifth transistor T5 may include a silicon semiconductor or may be implemented as a P-type transistor.

At least one light emitting element may include a light emitting element LD. An anode electrode of the light emitting element LD may be connected to (or coupled to) the first power line PL1 (or the first pixel electrode connected to the first power line PL1), and a cathode electrode of the light emitting element LD may be connected to a first node N1 (or the second pixel electrode). The light emitting element LD may generate light having a luminance (e.g., a set luminance or a predetermined luminance) corresponding to an amount of current (or driving current) supplied from the first transistor T1. The light emitting element LD may be the light emitting element LD described with reference to FIG. 1A-FIG. 4. However, the present disclosure is not limited thereto, and the light emitting element LD may be an organic light emitting element.

In some embodiments, at least one light emitting element may include a plurality of light emitting elements. The plurality of light emitting elements including the light emitting element LD may be connected to each other in parallel between the first power line PL1 and the first node N1.

In one or more example embodiments, the at least one light emitting element may further include a reverse light emitting element LDR. The reverse light emitting element LDR is connected in parallel between the first power line PL1 and the first node N1 (or, between the first pixel electrode and the second pixel electrode) together with the light emitting element LD constituting an effective light source, but it may be connected between the first power line PL1 and the first node N1 in an opposite direction to the light emitting element LD. For example, an anode electrode of the reverse light emitting element LDR may be connected to the cathode electrode of the light emitting element LD or the first node N1, and a cathode electrode of the reverse light emitting element LDR may be connected to the anode electrode of the light emitting element LD or the first power line PL1. The reverse light emitting element LDR maintains an inactive state even when a driving voltage (e.g., a set driving voltage or a predetermined driving voltage, for example, a driving voltage in a forward direction) is applied between the first power line PL1 and the first node N1, and thus a current may not substantially flow in the reverse light emitting element LDR.

A first electrode (or first transistor electrode) of the first transistor T1 may be connected to the first node N1, and a second electrode (or second transistor electrode) of the first transistor T1 may be connected to a third node N3, and a gate electrode of the first transistor T1 may be connected to a second node N2. For example, the first electrode of the first transistor T1 may be a drain electrode, and the second electrode of the first transistor T1 may be a source electrode, but the present disclosure is not limited thereto. The first transistor T1 may control an amount of current flowing through the light emitting element LD in response to a voltage of the second node N2.

A first electrode of the second transistor T2 may be connected to the data line DL, a second electrode of the second transistor T2 may be connected to the second node N2, and a gate electrode of the second transistor T2 may be connected to the scan line SC. When a first scan signal of a gate-on voltage level is supplied to the scan line SC, the second transistor T2 may be turned on, and the data signal (or data voltage) may be transmitted to the second node N2 from the data line DL.

The storage capacitor CST may be formed between the first power line PL1 and the second node N2. The storage capacitor CST may store a voltage of the second node N2 (e.g., a data signal applied to the second node N2).

A first electrode of the third transistor T3 may be connected to the sensing line RL, a second electrode of the third transistor T3 may be connected to the third node N3, and a gate electrode of the third transistor T3 may be connected to the sensing scan line SS. When a second scan signal of a gate-on voltage level is supplied to the sensing scan line SS, the third transistor T3 may be turned on, and an initialization voltage may be applied to the third node N3 from the sensing line RL, or a sensing signal (for example, sensing current) may be transmitted from the third node N3 to the sensing line RL. The sensing signal may be provided to the sensing driver 150 described with reference to FIG. 5.

A first electrode of the fourth transistor T4 may be connected to the first power line PL1, a second electrode of the fourth transistor T4 may be connected to the first node N1, and a gate electrode of the fourth transistor T4 may be connected to the sensing scan line SS. When the second scan signal of the gate-on voltage level is supplied to the sensing scan line SS, the fourth transistor T4 may be turned on, and may connect the first power line PL1 and the first node N1. In the sensing mode, the fourth transistor T4 may form a current flow path of the driving current flowing from the first power line PL1 to the first transistor T1.

A first electrode of the fifth transistor T5 may be connected to the third node N3, a second electrode of the fifth transistor T5 may be connected to the second power line PL2, and a gate electrode of the fifth transistor T5 may be connected to the emission control line EL. When the emission control signal of the gate-on voltage level is supplied to the emission control line EL, the fifth transistor T5 may be turned on, and the third node N3 and the second power line PL2 may be connected. In the display mode, the fifth transistor T5 may form a current flow path of the driving current flowing from the first power line PL1 to the second power line PL2 through the light emitting element LD, the first transistor T1, and the fifth transistor T5.

Figure 7A:
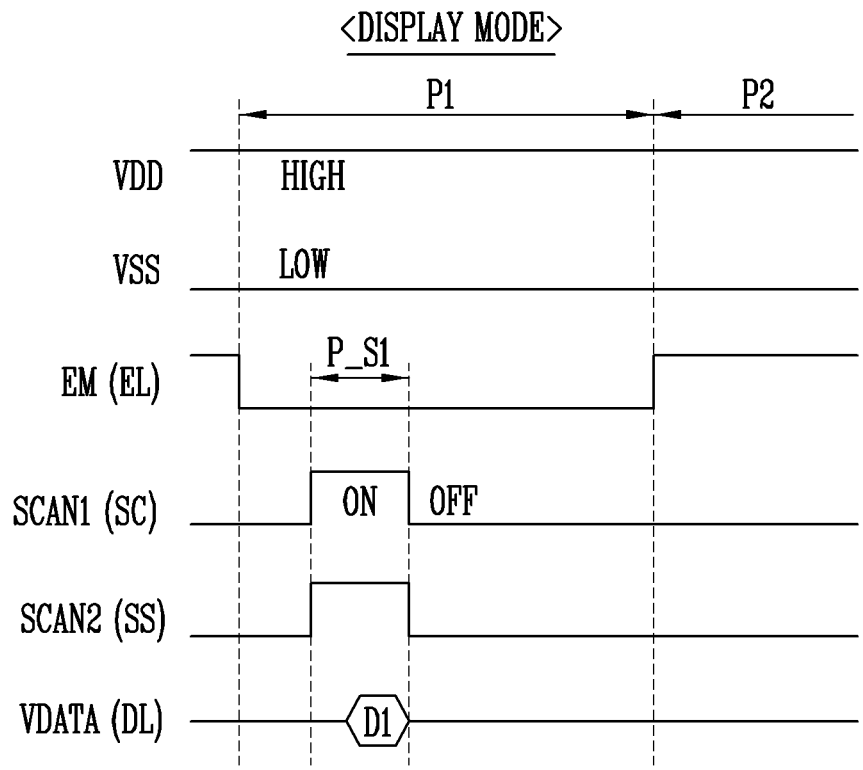
FIG. 7A and FIG. 7B illustrate diagrams for explaining an operation of the pixel of FIG. 6 in a display mode.
Figure 7B:
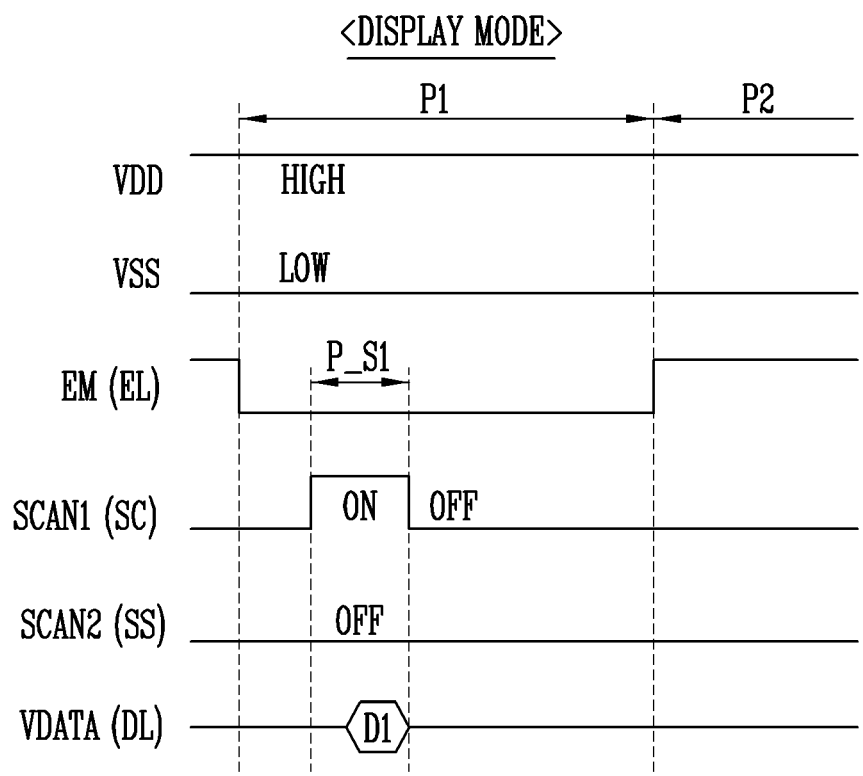
Figure 7C:
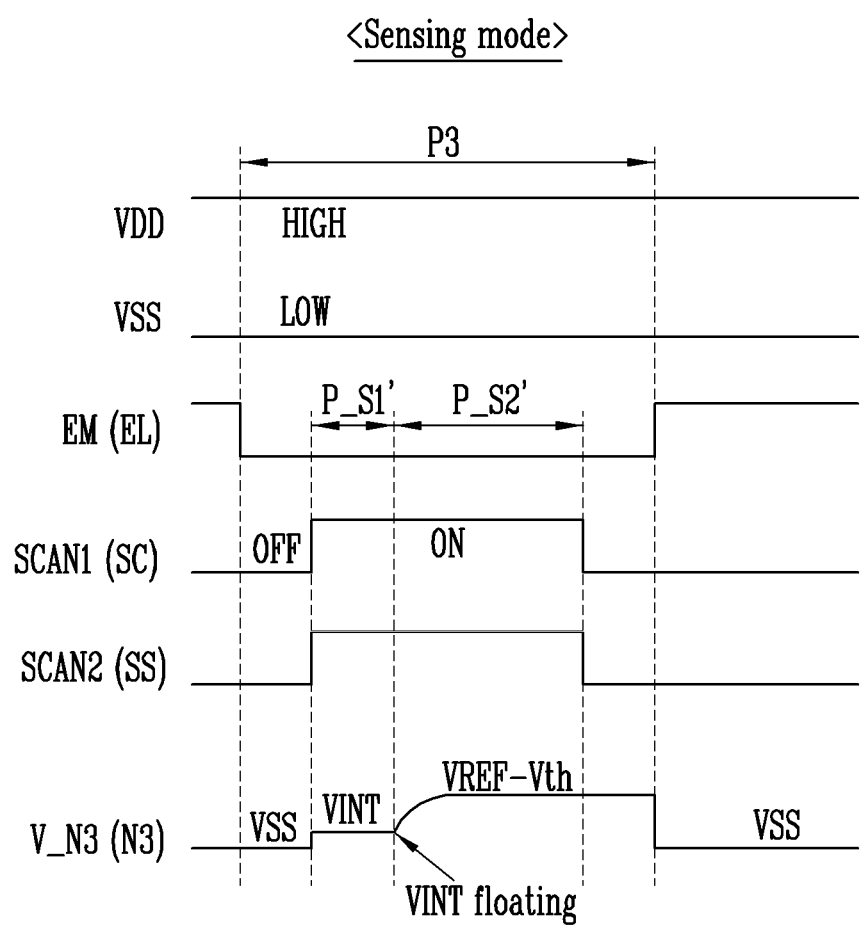
FIG. 7C illustrates a diagram for explaining an operation of the pixel of FIG. 6 in a sensing mode.

FIG. 7A, FIG. 7B, and FIG. 7C may be referenced to describe a more specific operation of the pixel PXL of FIG. 6.

FIG. 7A and FIG. 7B illustrate diagrams for explaining an operation of the pixel of FIG. 6 in a display mode. FIG. 7C illustrates a diagram for explaining an operation of the pixel of FIG. 6 in a sensing mode.

Referring to FIG. 6 and FIG. 7A-FIG. 7C, an emission control signal EM may be applied to the emission control line EL, a first scan signal SCAN1 may be applied to the scan line SC, a second scan signal SCAN2 may be applied to the sensing scan line SS, and a data voltage VDATA (or data signal) may be applied to the data line DL. The first power voltage VDD may have a constant voltage level (for example, a high voltage level (HIGH)), and the second power voltage VSS may have a constant voltage level (for example, a low voltage level (LOW) lower than the high voltage level (HIGH)).

Hereinafter, an operation of the pixel PXL in the display mode will be first described with reference to FIG. 7A and FIG. 7B.

As described with reference to FIG. 5, an effective data voltage is applied to (or written to) the pixel PXL in the display mode shown in FIG. 7A and FIG. 7B, and the pixel PXL may emit light with luminance corresponding to the effective data voltage.

The emission control signal EM may have a gate-off voltage level OFF (or a logic low level) in a first period P1, and may have a gate-on voltage level ON (or a logic high level) in a second period P2 other than the first period P1. Accordingly, in the first period P1, the fifth transistor T5 may be turned off in response to the emission control signal EM of the gate-off voltage level OFF, and in the second period P2, it may be turned on in response to the emission control signal EM of the gate-on voltage level ON.

In a first sub-period P_S1 in the first period P1, the first scan signal SCAN1 may have a pulse of the gate-on voltage level ON. A width of the first sub-period P_S1 (or a width of the pulse of the first scan signal SCAN1) is smaller than that of the first period P1, and for example, the width of the first sub-period P_S1 is 2 horizontal times, and the first period P1 may be greater than 3 horizontal times. Here, the horizontal time may be a period of a general horizontal synchronization signal or a period in which pixel rows of the display device 100 (see FIG. 5) are sequentially selected.

In this case, in the first sub-period P_S1, the second transistor T2 is turned on in response to the first scan signal SCAN1 of the gate-on voltage level ON, and the data voltage VDATA of the data line DL may be applied to the second node N2.

The data voltage VDATA may have a first data value D1 (or a voltage level) in at least a portion of the first sub-period P_S1. For example, when the first scan signal SCAN1 has a pulse of 2 horizontal times, after 1 horizontal time from a time point at which a pulse of the first scan signal SCAN1 occurs, the data voltage VDATA may have the first data value D1 for the pixel PXL.

Accordingly, the first data value D1 may be applied to the second node N2 in at least a portion of the first sub-period P_S1.

The storage capacitor CST may store the data voltage VDATA (for example, the first data value D1) provided to the second node N2 in the first sub-period P_S1. For example, the storage capacitor CST may be charged with a voltage corresponding to a difference between the first power voltage VDD and the first data value D1.

In one or more example embodiments, in the first sub-period P_S1, the second scan signal SCAN2 may have the pulse of the gate-on voltage level ON. A waveform and phase of the second scan signal SCAN2 may be substantially the same as a waveform and phase of the first scan signal SCAN1.

In this case, in the first sub-period P_S1, the third transistor T3 is turned on in response to the second scan signal SCAN2 of the gate-on voltage level ON, and the sensing line RL and the third node N3 may be connected. When an initialization voltage is applied from the sensing driver 150 to the sensing line RL, the initialization voltage may be applied to the third node N3. Here, the initialization voltage may be greater than or equal to the second power voltage VSS.

Similarly, in the first sub-period P_S1, the fourth transistor T4 is turned on in response to the second scan signal SCAN2 of the gate-on voltage level ON, and the first power line PL1 and the first node N1 may be connected. Accordingly, because the first power line PL1 and the first node N1 have the same voltage level, for example, because no driving voltage is applied to the light emitting element LD, the light emitting element LD may not emit light in the first sub-period P_S1.

In FIG. 7A, in the first sub-period P_S1, the second scan signal SCAN2 is illustrated as having the pulse of the gate-on voltage level ON, but the present disclosure is not limited thereto. For example, as shown in FIG. 7B, in the first sub-period P_S1 (and the first period P1), the second scan signal SCAN2 may have only the gate-off voltage level OFF.

Even in this case, because the fifth transistor T5 is turned off in the first period P1, the light emitting element LD may not emit light.

When the operation of the pixel PXL is summarized in the first sub-period P_S1 (or the first period P1) based on the first transistor T1, the gate electrode of the first transistor T1 has the first data value D1, the second electrode of the first transistor T1 has a voltage level corresponding to the initialization voltage (or the second power voltage VSS), and the gate-source voltage of the first transistor T1 (e.g., the voltage between the gate electrode and the second electrode of the first transistor T1) may be equal to the difference between the first data value D1 and the initialization voltage (i.e., the voltage at the third node N3 or the second power voltage VSS).

In one or more example embodiments, after the first sub-period P_S1, each of the first scan signal SCAN1 and the second scan signal SCAN2 has the gate-off voltage level OFF, and each of the second transistor T2, the third transistor T3, and the fourth transistors T4 may be turned off.

In the second period P2, the emission control signal EM has the gate-on voltage level ON, and the fifth transistor T5 may be turned on. Accordingly, a current flow path is formed from the first power line PL1 to the second power line PL2 through the light emitting element LD, the first transistor T1, and the fifth transistor T5, and the light emitting element LD may emit light with luminance corresponding to the gate-source voltage of the first transistor T1.

For reference, when the fifth transistor T5 is turned on, the third node N3 and the second power line PL2 are connected, and the voltage level of the third node N3 may be equal to the voltage level of the second power voltage VSS.

Although the voltage level of the third node N3, for example, the second electrode of the first transistor T1, is partially changed, the voltage level of the gate electrode of the first transistor T1 that is not connected to the third node N3 may be maintained at the voltage level of the gate electrode of the first transistor T1 during the first period P1 (e.g., the first data value D1), and the gate-source voltage of the first transistor T1 may be equal to the difference between the first data value D1 and the second power voltage VSS.

For example, the gate-source voltage of the first transistor T1 is determined only by the first data value D1, and accordingly, the driving current flowing through the first transistor T1 may be controlled (e.g., accurately controlled) regardless of changes in characteristics of the light emitting element LD. Therefore, the pixel PXL may accurately emit light at a desired luminance, and the display device 100 (FIG. 5) may display an image with uniform luminance (or substantially uniform luminance) without deviation or variations in luminance (or without substantial deviation or variations in luminance).

Hereinafter, an operation of the pixel PXL in the sensing mode will be described with reference to FIG. 7C.

As described with reference to FIG. 5, the characteristics of the pixel PXL (for example, the threshold voltage of the first transistor T1) may be sensed in a sensing mode (or a third period P3) illustrated in FIG. 7C.

The emission control signal EM may have the gate-off voltage level OFF (or the logic low level) in the third period P3. Accordingly, in the third period P3, the fifth transistor T5 may be turned off in response to the emission control signal EM of the gate-off voltage level OFF.

In a first sub-period P_S1' and a second sub-period P_S2' within the third period P3, the first scan signal SCAN1 may have a pulse of the gate-on voltage level ON. An entire width of the first sub-period P_S1' and the second sub-period P_S2' may be greater than the width of the first sub-period P_S1 described with reference to FIG. 7A.

In this case, in the first sub-period P_S1' and the second sub-period P_S2', the second transistor T2 may be turned on in response to the first scan signal SCAN1 of the gate-on voltage level ON, and the data line DL may be connected to the second node N2.

In the first sub-period P_S1' (and the second sub-period P_S2'), when a reference voltage VREF is applied to the data line DL, the reference voltage VREF may be applied to the second node N2. Here, the reference voltage VREF has a voltage level for sensing a threshold voltage Vth of the first transistor T1, and for example, the voltage level of the reference voltage VREF may be greater than the second power voltage VSS, and may be less than the first power voltage VDD. For example, the reference voltage VREF may be greater than or equal to a maximum value of the data voltage VDATA applied to the data line DL in the display mode, but is not limited thereto.

The storage capacitor CST may store the reference voltage VREF provided to the second node N2 in the first sub-period P_S1' (and the second sub-period P_S2').

Similar to the first scan signal SCAN1, in the first sub-period P_S1' and the second sub-period P_S2', the second scan signal SCAN2 may have a pulse of the gate-on voltage level ON. A waveform and phase of the second scan signal SCAN2 may be substantially the same as a waveform and phase of the first scan signal SCAN1.

In this case, in the first sub-period P_S1' and the second sub-period P_S2', the third transistor T3 may be turned on in response to the second scan signal SCAN2 of the gate-on voltage level ON, and the sensing line RL and the third node N3 may be connected. In one or more example embodiments, in the first sub-period P_S1' and the second sub-period P_S2', the fourth transistor T4 may be turned on in response to the second scan signal SCAN2 of the gate-on voltage level ON, and the first power line PL1 and the first node N1 may be connected.

When an initialization voltage VINT is applied from the sensing driver 150 (see FIG. 5) to the sensing line RL in the first sub-period P_S1', the initialization voltage VINT may be applied to the third node N3. Accordingly, a node voltage V_N3 of the third node N3 may be changed from the voltage level of the second power voltage VSS to a voltage level of the initialization voltage VINT.

Thereafter, in the second sub-period P_S2', the sensing driver 150 (see FIG. 5) may block the initialization voltage VINT from being supplied (that is, VINT floating).

In this case, the first transistor T1 supplies a current corresponding to the gate-source voltage to the third node N3, and accordingly, the node voltage V_N3 of the third node N3 may linearly increase to a specific voltage level. For example, the node voltage V_N3 of the third node N3 may increase to a voltage level corresponding to a difference between the reference voltage VREF and the threshold voltage Vth of the first transistor T1 (i.e., VREF-Vth).

Accordingly, the sensing driver 150 (see FIG. 5) may sense the threshold voltage Vth of the first transistor T1.

As described with reference to FIG. 6, FIG. 7A, and FIG. 7B, the light emitting element LD is connected between the first power line PL1 and the first node N1 (for example, the drain electrode of the first transistor T1), so that the gate-source voltage of the first transistor T1 may be determined or controlled only by the data voltage VDATA, and the light emitting element LD (and the pixel PXL) may emit light with a desired luminance.

In one or more example embodiments, as described with reference to FIG. 7C, the pixel PXL includes the fourth transistor T4 connected between the first power line PL1 and the first node N1 and the third transistor T3 connected to the third node N3, so that the display device 100 (see FIG. 5) may sense the characteristic (for example, the threshold voltage Vth) of the first transistor T1, and may compensate for the data voltage VDATA (see FIG. 7A) corresponding to the characteristic (or the characteristic change) of the first transistor T1. Therefore, the pixel PXL may emit light with a desired luminance.

Figure 8:
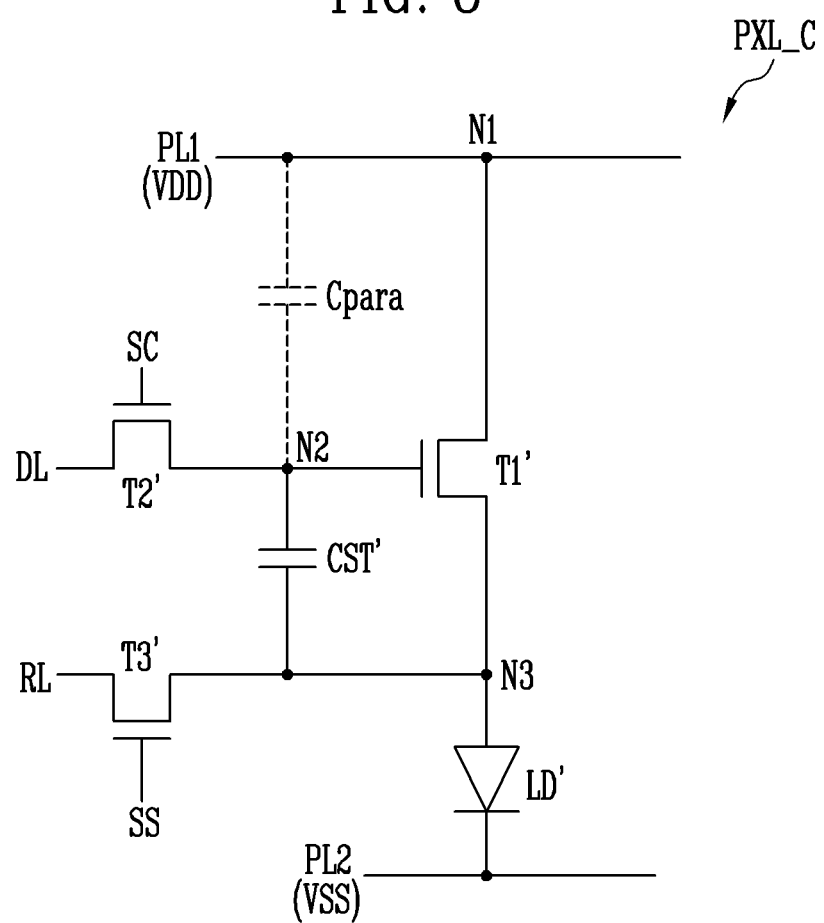
FIG. 8 illustrates a circuit diagram of a comparative example of a pixel included in the display device of FIG. 5.

FIG. 8 illustrates a circuit diagram of a comparative example of a pixel included in the display device of FIG. 5.

Referring to FIG. 8, a pixel PXL_C of FIG. 8 may include a light emitting element LD', a first transistor T1', a second transistor T2', a third transistor T3', and a storage capacitor CST'. The first transistor T1', the second transistor T2', and the third transistor T3' are substantially the same as the first transistor T1, the second transistor T2, and the third transistor T3 described with reference to FIG. 7A (or FIG. 6), respectively, so a duplicated description will not be repeated.

The light emitting element LD' may be connected between the third node N3 and the second power line PL2. The storage capacitor CST' may be formed between the second node N2 and the third node N3. In one or more example embodiments, a parasitic capacitor Cpara may be formed between the first power line PL1 and the second node N2.

In the first sub-period P_S1 described with reference to FIG. 7A, it is assumed that the first scan signal of the gate-on voltage level is provided to the scan line SC and the second scan signal of the gate-on voltage level is provided to the sensing scan line SS.

In this case, a gate voltage of the first transistor T1' may have the same voltage level as the data voltage of the data line DL, and a second electrode of the first transistor T1' (i.e., the third node N3) may have the same voltage level as the initialization voltage applied to the sensing line RL. Accordingly, a gate-source voltage of the first transistor T1' may have a voltage corresponding to the difference between the data voltage and the initialization voltage, and the corresponding voltage may be stored in the storage capacitor CST'.

In one or more example embodiments, after the first sub-period P_S1 (e.g., as described with reference to FIG. 7A), it is assumed that the first scan signal of the gate-off voltage level is provided to the scan line SC and the second scan signal of the gate-off voltage level is provided to the sensed scan line SS.

In this case (e.g., see FIG. 8), the first transistor T1' provides a current corresponding to the gate-source voltage from the first power line PL1 to the third node N3, and the node voltage of the third node N3 may increase corresponding to the threshold voltage of the light emitting element LD. The threshold voltage of the light emitting element LD' is changed by light emitting stress (for example, when continuously emitting light at the maximum luminance, the threshold voltage of the light emitting element LD' may be shifted), and accordingly, the node voltage of the third node N3 may be changed. If there is no parasitic capacitor Cpara, even if the node voltage of the third node N3 is changed, the gate-source voltage of the first transistor T1' is maintained at the same as the gate-source voltage in the first sub-period P_S1 (e.g., the period in which the data voltage is written) by the storage capacitor CST'. However, an amount of change in the node voltage of the third node N3 is divided among the storage capacitor CST' and the parasitic capacitor Cpara by the parasitic capacitor Cpara, and the gate-source voltage of the first transistor T1' (e.g., the voltage charged in the storage capacitor CST') may be different from the gate-source voltage in the first sub-period P_S1 (e.g., the period in which the data voltage is written). Therefore, according to the stress on the light emitting element LD', the pixel PXL_C may not emit light at a desired luminance, and the display device including the pixel PXL_C of FIG. 8 may have a luminance deviation.

In one or more example embodiments, when the storage capacitor CST' is connected between the third node N3 and the second node N2, the change in the node voltage of the third node N3 is reflected in the gate-source voltage of the first transistor T1' as it is, and the pixel PXL_C does not emit light at a desired luminance.

Alternatively, the pixel PXL of FIG. 6 includes the light emitting element LD disposed between the first power line PL1 and the first node N1, so that it is possible to prevent or substantially prevent influence due to the parasitic capacitor (e.g., Cpara of FIG. 8) between the first power line PL1 and the second node N2.

Figure 9:
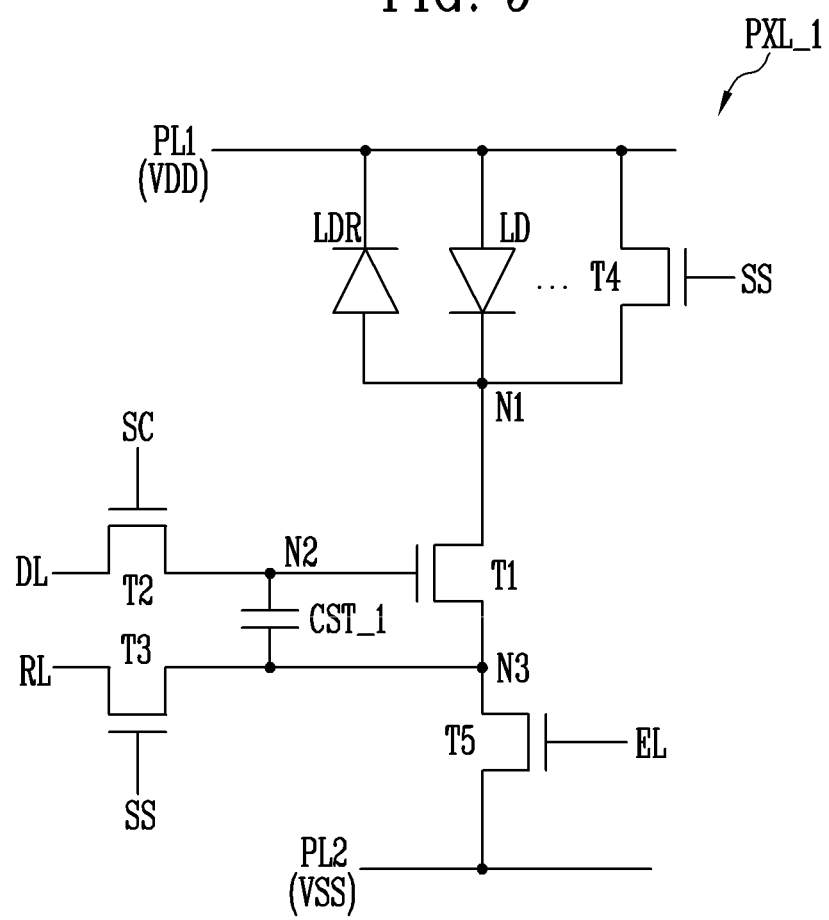
FIG. 9 illustrates a circuit diagram of another example of a pixel included in the display device of FIG. 5.

FIG. 9 illustrates a circuit diagram of another example of a pixel included in the display device of FIG. 5.

Referring to FIG. 6 and FIG. 9, except for a connection configuration of a storage capacitor CST_1, a pixel PXL_1 may be substantially the same as or similar to the pixel PXL of FIG. 6. Therefore, a duplicated description will not be repeated.

The storage capacitor CST_1 may be connected between the second node N2 (or the gate electrode of the first transistor T1) and the third node N3 (or the second electrode of the first transistor T1). The storage capacitor CST_1 may store a voltage between the second node N2 and the third node N3.

An operation of the pixel PXL_1 is substantially the same as or similar to the operation of the pixel PXL described with reference to FIG. 7A-FIG. 7C, so a duplicated description will not be repeated.

In the first sub-period P_S1 described with reference to FIG. 7A, the first scan signal of the gate-on voltage level may be provided to the scan line SC, and the second scan signal of the gate-on voltage level may be provided to the sensing scan line SS. In this case, the second transistor T2 and the third transistor T3 may be turned on, the data voltage of the data line DL may be applied to the second node N2, the initialization voltage of the sensing line RL may be provided to the third node N3, and the storage capacitor CST_1 may be charged with a voltage corresponding to the difference between the data voltage and the initialization voltage.

Thereafter, when the fifth transistor T5 is turned on, the node voltage of the third node N3 may be changed from the initialization voltage to the second power voltage VSS.

A parasitic capacitor may be formed between the first power line PL1 and the second node N2, and the amount of change in the node voltage of the third node N3 (for example, the difference between the initialization voltage and the second power voltage VSS) may not be reflected by the parasitic capacitor, as it is. However, because the initialization voltage and the second power voltage VSS have a fixed value regardless of changes in characteristics of the light emitting element LD, the gate-source voltage of the first transistor T1 may be adjusted (e.g., easily adjusted) to have a desired value.

In some embodiments, the initialization voltage applied to the sensing line RL may be set equal to the second power voltage VSS. In this case, while the pixel PXL_1 emits light, the node voltage of the third node N3 may be maintained at the same level as the node voltage of the third node N3 when the data voltage is written to the pixel PXL_1, for example, the node voltage of the third node N3 may not be changed. Accordingly, the gate-source voltage of the first transistor T1 may be determined only by the data value, and the driving current flowing through the first transistor T1 may be accurately controlled regardless of changes in characteristics of the light emitting element LD.

As described with reference to FIG. 6 and FIG. 9, the pixel PXL_1 may include the storage capacitor CST_1 connected between the second node N2 and the third node N3.

Figure 10:
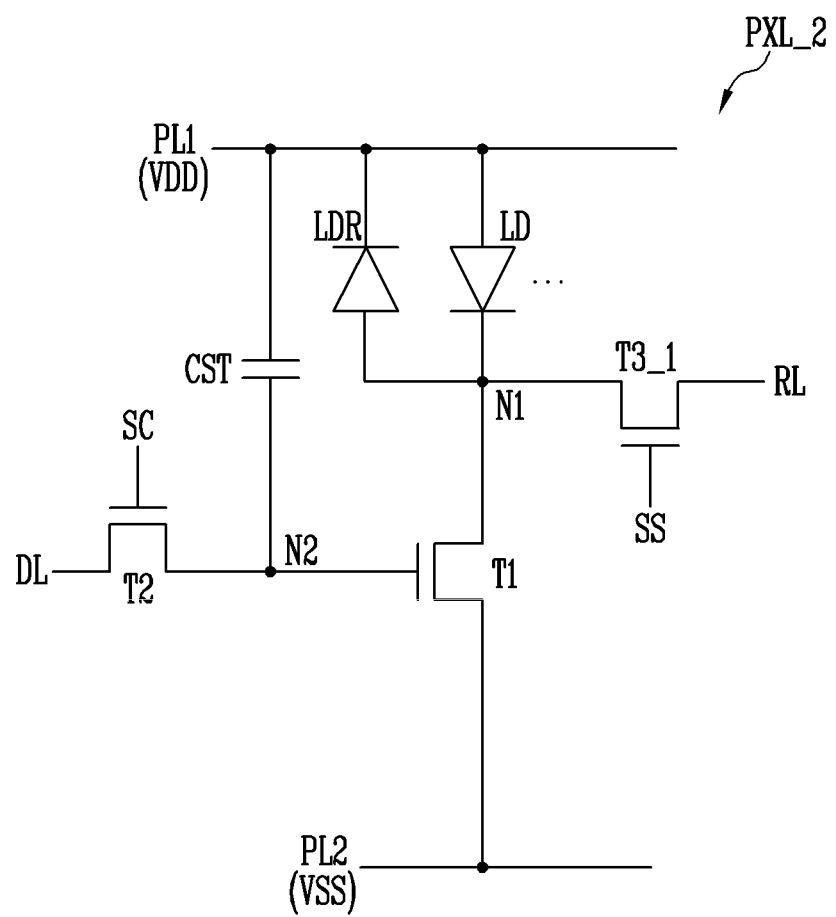
FIG. 10 illustrates a circuit diagram of another example of a pixel included in the display device of FIG. 5.

FIG. 10 illustrates a circuit diagram of another example of a pixel included in the display device of FIG. 5.

Referring to FIG. 6 and FIG. 10, a pixel PXL_2 is different from the pixel PXL of FIG. 6 in that the pixel PXL_2 includes the third transistor T3_1 and does not include the fourth transistor T4 and the fifth transistor T5.

A light emitting element LD, a reverse light emitting element LDR, a first transistor T1, a second transistor T2, and a storage capacitor CST may be substantially the same as or similar to the light emitting element LD, the reverse light emitting element LDR, the first transistor T1, the second transistor T2, and the storage capacitor CST described with reference to FIG. 6, respectively. Therefore, a duplicated description will not be repeated.

The first electrode (or the first transistor electrode) of the first transistor T1 may be connected to the first node N1, and the second electrode (or the second transistor electrode) of the first transistor T1 may be connected to the second power line PL2, and the gate electrode of the first transistor T1 may be connected to the second node N2. The first transistor T1 may control an amount of current flowing from the first power line PL1 to the second power line PL2 through the light emitting element LD in response to the voltage of the second node N2.

A first electrode of the third transistor T3_1 may be connected to the first node N1, a second electrode of the third transistor T3_1 may be connected to the sensing line RL, and a gate electrode of the third transistor T3_1 may be connected to the sensing scan line SS. When the second scan signal SCAN2 of the gate-on voltage level is supplied to the sensing scan line SS, the third transistor T3_1 may be turned on, and the initialization voltage may be applied to the first node N1 from the sensing line RL, or the sensing signal (for example, sensing current) may be transmitted from the first node N1 to the sensing line RL.

An operation of the pixel PXL_2 in the display mode may be similar to the operation of the pixel PXL described with reference to FIG. 7A.

Referring to FIG. 7A and FIG. 10, in the first sub-period P_S1, the second scan signal SCAN2 having the pulse of the gate-on voltage level ON may be applied to the sensing scan line SS, the third transistor T3_1 may be turned on in response to the second scan signal SCAN2 of the gate-on voltage level ON, and the sensing line RL and the first node N1 may be connected. When the initialization voltage is applied from the sensing driver 150 to the sensing line RL, the initialization voltage may be applied to the first node N1. The initialization voltage applied to the pixel PXL_2 of FIG. 10 may be the same as or similar to the first power voltage VDD. The difference between the first power voltage VDD and the initialization voltage may be smaller than the driving voltage (or threshold voltage) of the light emitting element LD.

In addition, in the first sub-period P_S1, the first scan signal SCAN1 having the pulse of the gate-on voltage level ON may be applied to the scan line SC, the second transistor T2 may be turned on in response to the first scan signal SCAN1 of the gate-on voltage level ON, and the data voltage VDATA of the data line DL may be applied to the second node N2.

The storage capacitor CST may store the data voltage VDATA provided to the second node N2 in the first sub-period P_S1.

In the second period P2, each of the first scan signal SCAN1 and the second scan signal SCAN2 may have the gate-off voltage level OFF, and each of the second transistor T2 and the third transistor T3_1 may be turned off. In this case, a current flow path may be formed from the first power line PL1 to the second power line PL2 through the light emitting element LD and the first transistor T1, and the light emitting element LD may emit light with luminance corresponding to the gate-source voltage of the first transistor T1.

The gate-source voltage of the first transistor T1 may be determined by the data voltage applied to the data line DL, and accordingly, the driving current flowing through the first transistor T1 may be controlled (e.g., accurately controlled) regardless of changes in characteristics of the light emitting element LD. For example, the pixel PXL_2 may emit light (e.g., accurately emit light) at a desired luminance, and the display device 100 (FIG. 5) may display an image with a uniform luminance (or substantially uniform luminance) without deviation or variations in luminance (or without substantial deviation or variations in luminance).

Figure 11:
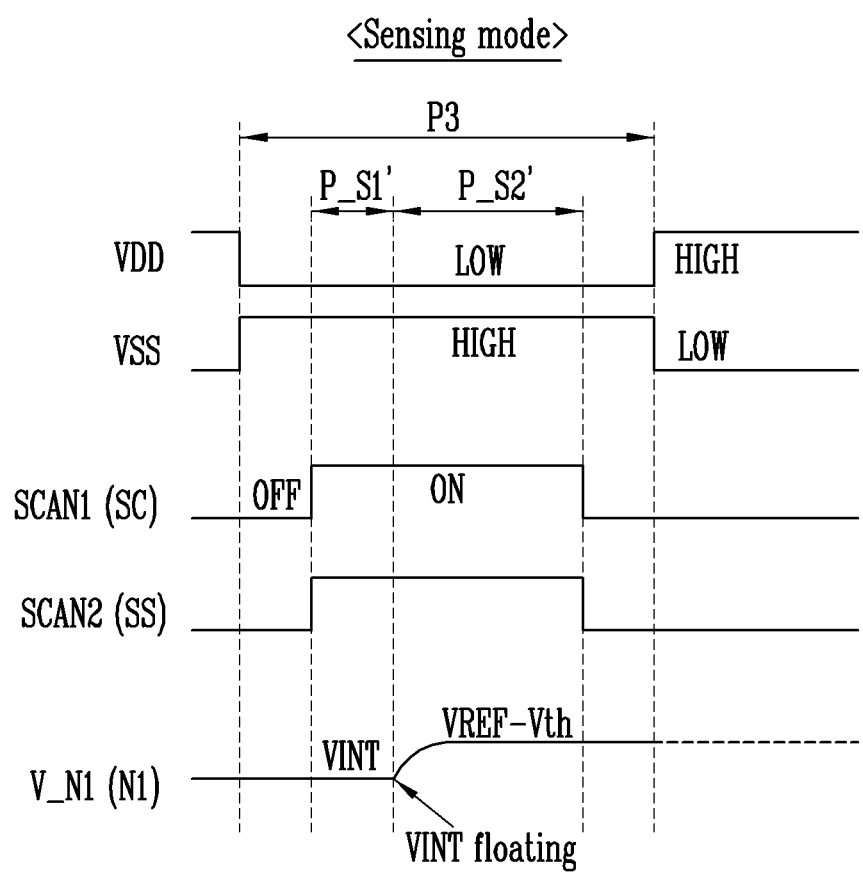
FIG. 11 illustrates a diagram for explaining an operation of the pixel of FIG. 10.

FIG. 11 may be referred to describe an operation of the pixel PXL_2 in the sensing mode.

FIG. 11 illustrates a diagram for explaining the operation of the pixel of FIG. 10.

Referring to FIG. 11, the first scan signal SCAN1 may be applied to the scan line SC, and the second scan signal SCAN2 may be applied to the sensing scan line SS.

In the third period P3, the first power voltage VDD may be changed to have the low voltage level LOW (or the second voltage level) from the high voltage level HIGH (or the first voltage level). The second power voltage VSS may be changed to have the high voltage level HIGH from the low voltage level LOW. For example, in the third period P3, the first power voltage VDD and the second power voltage VSS may have mutually-oppositely changed voltage levels, or the power supply 170 (see FIG. 5) may apply the mutually-oppositely changed power voltages to the first power line PL1 and the second power line PL2. In this case, because the voltage is applied in a reverse direction to the light emitting element LD, the light emitting element LD may not emit light (e.g., the light emitting element LD may be reverse biased).

In the first sub-period P_S1' and the second sub-period P_S2' within the third period P3, the first scan signal SCAN1 may have the pulse of the gate-on voltage level ON.

In this case, in the first sub-period P_S1' and the second sub-period P_S2', the second transistor T2 may be turned on in response to the first scan signal SCAN1 of the gate-on voltage level ON, and the data line DL may be connected to the second node N2. In the first sub-period P_S1' (and the second sub-period P_S2'), when the reference voltage VREF is applied to the data line DL, the reference voltage VREF may be applied to the second node N2.

The storage capacitor CST may store the reference voltage VREF provided to the second node N2 in the first sub-period P_S1' (and the second sub-period P_S2').

Similar to the first scan signal SCAN1, in the first sub-period P_S1' and the second sub-period P_S2', the second scan signal SCAN2 may have the pulse of the gate-on voltage level ON.

In this case, in the first sub-period P_S1' and the second sub-period P_S2', the third transistor T3_1 may be turned on in response to the second scan signal SCAN2 of the gate-on voltage level ON, and the sensing line RL and the first node N1 may be connected.

When the initialization voltage VINT is applied from the sensing driver 150 (see FIG. 5) to the sensing line RL in the first sub-period P_S1', the initialization voltage VINT may be applied to the first node N1. Therefore, the node voltage V_N1 of the first node N1 may have the voltage level of the initialization voltage VINT.

Thereafter, in the second sub-period P_S2', the sensing driver 150 may block the initialization voltage VINT from being supplied (e.g., VINT floating).

In this case, the first transistor T1 may supply a current corresponding to the gate-source voltage (or the voltage between the first node N1 and the second node N2) from the second power line PL2 to the first node N1, and accordingly, the node voltage V_N1 of the first node N1 may linearly increase to a specific voltage level. For example, the node voltage V_N1 of the first node N1 may increase to the voltage level corresponding to the difference between the reference voltage VREF and the threshold voltage Vth of the first transistor T1 (i.e., VREF-Vth).

Accordingly, the sensing driver 150 (see FIG. 5) may sense the threshold voltage Vth of the first transistor T1.

As described with reference to FIG. 10 and FIG. 11, the light emitting element LD is connected between the first power line PL1 and the first node N1 (for example, the drain electrode of the first transistor T1), so that the gate-source voltage of the first transistor T1 may be determined or controlled only by the data voltage applied through the data line DL, and the light emitting element LD (and the pixel PXL_2) may emit light with a desired luminance.

In one or more example embodiments, the pixel PXL_2 includes the third transistor T3_1 connected to the first node N1 (e.g., the cathode electrode of the light emitting element LD, or the first electrode of the first transistor T1), and in sensing mode, voltages that are mutually reversed may be applied to the first power line PL1 and the second power line PL2. Accordingly, the display device 100 (see FIG. 5) may sense the characteristic (for example, the threshold voltage Vth) of the first transistor T1, may compensate for the data voltage corresponding to the characteristic (or the characteristic change) of the first transistor T1, and may display an image with uniform luminance (or substantially uniform luminance) without luminance deviation or variations (or without substantial deviation or variations in luminance) due to the characteristic (or the characteristic change) of the first transistor T1.

Figure 12:
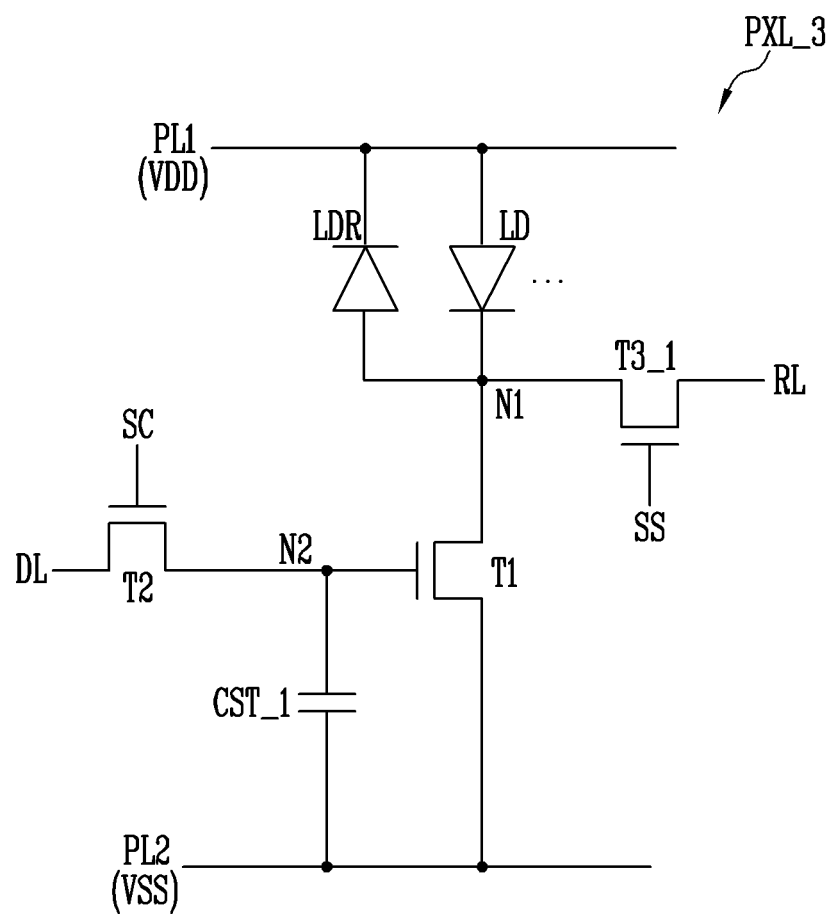
FIG. 12 illustrates a circuit diagram of another example of a pixel included in the display device of FIG. 5.

FIG. 12 illustrates a circuit diagram of another example of a pixel included in the display device of FIG. 5.

Referring to FIG. 10 and FIG. 12, except for a connection configuration of the storage capacitor CST_1, a pixel PXL_3 may be substantially the same as or similar to the pixel PXL_2 of FIG. 10. Therefore, a duplicated description will not be repeated.

The storage capacitor CST_1 may be connected between the second node N2 (or the gate electrode of the first transistor T1) and the second power line PL2 (or the second electrode of the first transistor T1). The storage capacitor CST_1 may be charged with the voltage between the second node N2 and the second power line PL2.

An operation of the pixel PXL_3 is substantially the same as or similar to the operation of the pixel PXL_2 described with reference to FIG. 10 and FIG. 11, so a duplicated description will not be repeated.

The gate-source voltage of the first transistor T1 is equal to the voltage between the second node N2 and the second power line PL2, and accordingly, the gate-source voltage of the first transistor T1 may be determined only by the data voltage, and the driving current flowing through the first transistor T1 may be accurately controlled regardless of the characteristic change of the light emitting element LD.

As described with reference to FIG. 10 and FIG. 12, the pixel PXL_3 may include the storage capacitor CST_1 connected between the second node N2 and the second power line PL2.

The technical scope of the present disclosure may be determined by on the technical scope of the accompanying claims. In one or more example embodiments, all changes or modifications that come within the meaning and range of the claims and their equivalents will be interpreted as including the range of the present disclosure.

What is claimed is:
1. A display device comprising:
a first power line;
a second power line;
a data line;
a first scan line;
a second scan line;
a light emitting element connected between the first power line and a first node;
a first transistor connected between the first node and the second power line and comprising a gate electrode connected to a second node;
a second transistor connected between the data line and the second node and comprising a gate electrode connected to the first scan line;

a fourth transistor connected between the first power line and the first node and comprising a gate electrode connected to the second scan line;
an emission control line;
a scan driver configured to provide a first scan signal to the first scan line and to provide a second scan signal to the second scan line;
an emission driver configured to provide an emission control signal to the emission control line;
a data driver configured to provide a data signal to the data line; and
a sensing driver configured to receive a sensing signal corresponding to a threshold voltage of the first transistor through a sensing line,
wherein in a second period in which the emission driver is to provide the emission control signal having a gate-off voltage level to the emission control line, the scan driver is to provide the first scan signal having a gate-on voltage level to the first scan line and to provide the second scan signal having a gate-on voltage level to the second scan line,
wherein, in the second period, the data driver is to provide a reference voltage to the data line, and
wherein the sensing driver is to apply an initialization voltage to the sensing line in a first sub-period of the second period and is to receive the sensing signal in a second sub-period of the second period.

2. The display device of claim 1, wherein a first power voltage applied to the first power line is greater than a second power voltage applied to the second power line, and
wherein an anode electrode of the light emitting element is connected to the first power line.

3. The display device of claim 1, further comprising
a third transistor connected to a second electrode of the first transistor and the sensing line and comprising a gate electrode connected to the second scan line,
wherein a first electrode of the first transistor is connected to the first node.

4. The display device of claim 3, further comprising
a fifth transistor connected between the second electrode of the first transistor and the second power line and comprising a gate electrode connected to the emission control line.

5. The display device of claim 4, wherein at least one of the first to fifth transistors comprises an oxide semiconductor.

6. The display device of claim 4, further comprising
a storage capacitor between the first power line and the second node.

7. The display device of claim 4, further comprising
a storage capacitor between the second electrode of the first transistor and the second node.

8. The display device of claim 1, wherein, in a first period in which the emission driver is to provide the emission control signal having a gate-off voltage level to the emission control line:
the scan driver is to provide the first scan signal having a gate-on voltage level to the first scan line and to provide the second scan signal having a gate-off voltage level to the second scan line; and
the data driver is to provide the data signal to the data line.

9. The display device of claim 1, wherein the light emitting element comprises a plurality of light emitting elements connected in parallel to each other.

10. The display device of claim 9, wherein each of the light emitting elements comprises an anode electrode and a cathode electrode, and
wherein the anode electrode of at least one of the light emitting elements is connected to the cathode electrode of other ones of the light emitting elements.

11. A display device comprising:
a first power line;
a second power line;
a data line;
a sensing line;
a first scan line;
a second scan line;
a light emitting element connected between the first power line and a first node;
a first transistor connected between the first node and the second power line and comprising a gate electrode connected to a second node;
a second transistor connected between the data line and the second node and comprising a gate electrode connected to the first scan line;
a third transistor connected between the first node and the sensing line and comprising a gate electrode connected to the second scan line;
a scan driver configured to provide a first scan signal to the first scan line and to provide a second scan signal to the second scan line;
a data driver configured to provide a data signal to the data line; and
a sensing driver configured to receive a sensing signal corresponding to a threshold voltage of the first transistor through the sensing line,
wherein, in a first period, a first power voltage applied to the first power line is changed to be less than a second power voltage applied to the second power line,
wherein, in the first period, the scan driver is to provide the first scan signal having a gate-on voltage level to the first scan line, and to provide the second scan signal having a gate-on voltage level to the second scan line,
wherein, in the first period, the data driver is to provide a reference voltage to the data line, and
wherein, the sensing driver is to apply an initialization voltage to the sensing line in a first sub-period of the first period, and is to receive the sensing signal in a second sub-period of the first period.

12. The display device of claim 11, wherein the first power voltage applied to the first power line is greater than the second power voltage applied to the second power line, and
wherein an anode electrode of the light emitting element is connected to the first power line.

13. The display device of claim 12, further comprising
a storage capacitor between the first power line and the second node.

14. The display device of claim 12, further comprising
a storage capacitor between the second node and the second power line.

15. A display device comprising:
a first power line;
a second power line;
a data line;
a first scan line;
a second scan line;
a light emitting element connected between the first power line and a first node;
a first transistor connected between the first node and the second power line and comprising a gate electrode connected to a second node;

a second transistor connected between the data line and the second node and comprising a gate electrode connected to the first scan line;

a fourth transistor connected between the first power line and the first node and comprising a gate electrode connected to the second scan line;

a third transistor connected to a second electrode of the first transistor and a sensing line and comprising a gate electrode connected to the second scan line, wherein a first electrode of the first transistor is connected to the first node;

an emission control line;

a fifth transistor connected between the second electrode of the first transistor and the second power line and comprising a gate electrode connected to the emission control line;

a storage capacitor between the first power line and the second node;

a scan driver configured to provide a first scan signal to the first scan line and to provide a second scan signal to the second scan line;

an emission driver configured to provide an emission control signal to the emission control line;

a data driver configured to provide a data signal to the data line; and a sensing driver configured to receive a sensing signal corresponding to a threshold voltage of the first transistor through the sensing line, wherein, in a first period in which the emission driver is to provide the emission control signal having a gate-off voltage level to the emission control line:
the scan driver is to provide the first scan signal having a gate-on voltage level to the first scan line and to provide the second scan signal having a gate-on voltage level to the second scan line; and
the data driver is to provide the data signal to the data line.

* * * * *